United States Patent
Kirita

(10) Patent No.: US 11,495,777 B2
(45) Date of Patent: Nov. 8, 2022

(54) SELF-LUMINOUS ELEMENT, SELF-LUMINOUS PANEL, AND SELF-LUMINOUS PANEL MANUFACTURING METHOD

(71) Applicant: JOLED Inc., Tokyo (JP)

(72) Inventor: Shina Kirita, Tokyo (JP)

(73) Assignee: JOLED INC., Tokyo (JP)

( * ) Notice: Subject to any disclaimer, the term of this patent is extended or adjusted under 35 U.S.C. 154(b) by 100 days.

(21) Appl. No.: 17/035,779

(22) Filed: Sep. 29, 2020

(65) Prior Publication Data
US 2021/0098745 A1 Apr. 1, 2021

(30) Foreign Application Priority Data

Sep. 30, 2019 (JP) .............................. JP2019-180071
Aug. 17, 2020 (JP) .............................. JP2020-137582

(51) Int. Cl.
*H01L 51/52* (2006.01)
*H01L 27/32* (2006.01)
(Continued)

(52) U.S. Cl.
CPC ...... *H01L 51/5265* (2013.01); *H01L 27/3244* (2013.01); *H01L 51/0005* (2013.01);
(Continued)

(58) Field of Classification Search
CPC ............. H01L 51/5265; H01L 51/0005; H01L 51/5218; H01L 51/5234; H01L 51/56;
(Continued)

(56) References Cited

U.S. PATENT DOCUMENTS

| 7,102,282 B1 | 9/2006 | Yamada et al. |
| 2006/0192471 A1 | 8/2006 | Inoue et al. |

(Continued)

FOREIGN PATENT DOCUMENTS

| JP | 2006-244713 A | 9/2006 |
| JP | 2008-091860 A | 4/2008 |

(Continued)

*Primary Examiner* — Kyoung Lee
*Assistant Examiner* — Christina A Sylvia
(74) *Attorney, Agent, or Firm* — Xsensus LLP

(57) ABSTRACT

A light-emitting element includes: a light-reflective first electrode; a light-emitting layer above the first electrode; a light-transmissive second electrode above the light-emitting layer; a first light-transmissive layer on the second electrode; and a second light-transmissive layer on the first layer. First optical cavity structure is formed between surface of the first electrode facing the light-emitting layer and surface of the second electrode facing the light-emitting layer. The first optical cavity structure corresponds to, as peak wavelength, first wavelength longer than peak wavelength of light emitted from the light-emitting layer. Second optical cavity structure is formed between the surface of the first electrode facing the light-emitting layer and an interface between the first layer and the second layer. The second optical cavity structure corresponds to, as peak wavelength, second wavelength shorter than the first wavelength. The first and second layers differ in refractive index from each other by 0.3 or greater.

15 Claims, 10 Drawing Sheets

(51) Int. Cl.
*H01L 51/00* (2006.01)
*H01L 51/56* (2006.01)

(52) U.S. Cl.
CPC ...... *H01L 51/5218* (2013.01); *H01L 51/5234* (2013.01); *H01L 51/56* (2013.01); *H01L 2227/323* (2013.01); *H01L 2251/303* (2013.01); *H01L 2251/305* (2013.01); *H01L 2251/306* (2013.01)

(58) Field of Classification Search
CPC ............ H01L 51/5275; H01L 51/5203; H01L 51/5012; H01L 2227/323; H01L 2251/303; H01L 2251/305; H01L 2251/306; H01L 2251/5315; H01L 2251/558; H01L 27/3211; H01L 27/3244
See application file for complete search history.

(56) References Cited

U.S. PATENT DOCUMENTS

| | | |
|---|---|---|
| 2008/0054799 A1 | 3/2008 | Satou |
| 2012/0104423 A1 | 5/2012 | Kurata et al. |
| 2012/0152347 A1* | 6/2012 | Lee ........................ H01L 51/442 136/256 |
| 2016/0027935 A1* | 1/2016 | Naito ................... H01L 31/0749 438/98 |
| 2018/0151840 A1 | 5/2018 | Fukuda |
| 2018/0248154 A1* | 8/2018 | Shirahase ........... H01L 51/5218 |
| 2019/0189713 A1* | 6/2019 | Kondo ................ H01L 51/5221 |

FOREIGN PATENT DOCUMENTS

| | | |
|---|---|---|
| JP | 2011-076799 A | 4/2011 |
| JP | 2018-088365 A | 6/2018 |
| WO | 01/039554 A1 | 5/2001 |
| WO | 2012/020452 A1 | 2/2012 |
| WO | 2014/065084 A1 | 5/2014 |

* cited by examiner

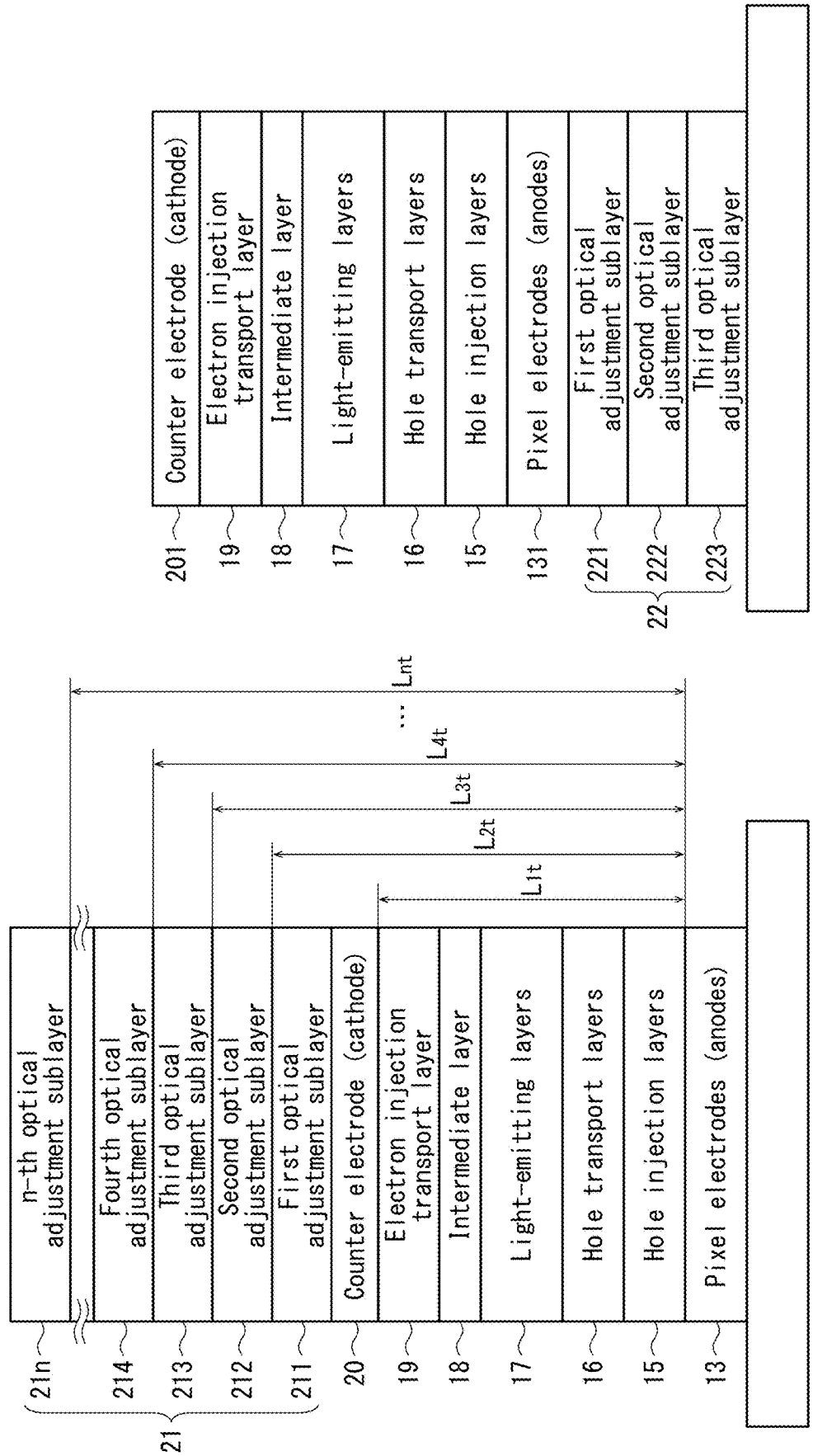

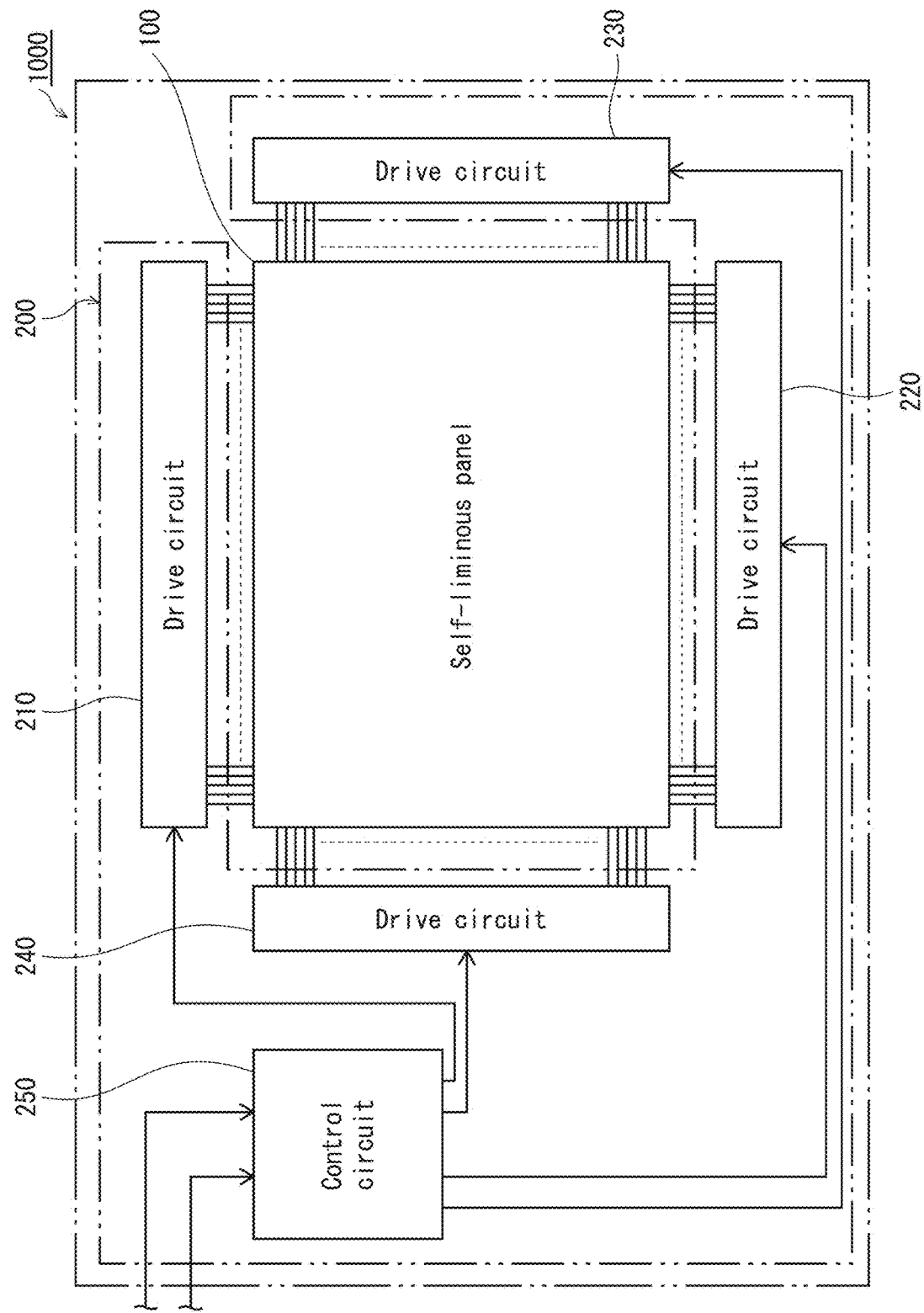

SELF-LUMINOUS ELEMENT, SELF-LUMINOUS PANEL, AND SELF-LUMINOUS PANEL MANUFACTURING METHOD

CROSS-REFERENCE TO RELATED APPLICATIONS

This application claims priority to Japanese Patent Application No. 2019-180071, filed Sep. 30, 2019 and Japanese Patent Application No. 2020-137582, filed Aug. 17, 2020, the contents of each are hereby incorporated by reference in their entirety.

BACKGROUND

Technical Field

The present disclosure relates to light-emitting elements employing electroluminescence and quantum dot effects, self-luminous panels using light-emitting elements, and self-luminous panel manufacturing methods.

Description of Related Art

In recent years, display devices using organic EL elements employing electroluminescence of organic materials and self-luminous elements employing quantum dot effects such as quantum dot light-emitting diodes (QLEDs) have become increasingly widespread.

Self-luminous elements have a structure in which a functional layer is disposed between an anode and a cathode and the functional layer includes at least a light-emitting layer. Examples of the functional layer, other than the light-emitting layer, include a functional layer (such as an electron injection layer and an electron transport layer) which is disposed between the light-emitting layer and the cathode for supplying electrons to the light-emitting layer, and a functional layer (such as a hole transport layer and a hole injection layer) which is disposed between the light-emitting layer and the anode for supplying holes to the light-emitting layer.

There has also been a demand for self-luminous elements with an improved light extraction efficiency of light-emitting element of colors, from the standpoint of power consumption reduction and operating life increase. As one technique for improving this light extraction efficiency, a technique of adopting cavity structures to organic EL elements of colors as self-luminous elements has been known, for example as described in International Publication No. WO 2012/020452.

SUMMARY

The present disclosure describes a light-emitting element that has both a light-extraction efficiency improved by an optical cavity structure and a functional layer with an optimized film thickness, and thereby has an increased efficiency of outputting light of a desired wavelength as a peak wavelength and thus has an increased operating life.

A light-emitting element pertaining to at least one aspect of the present disclosure is a light-emitting element including: a first electrode that is light-reflective; a light-emitting layer disposed above the first electrode; a second electrode that is light-transmissive and is disposed above the light-emitting layer; a first light-transmissive layer disposed on the second electrode; and a second light-transmissive layer disposed on the first light-transmissive layer. A first optical cavity structure is formed between a surface of the first electrode facing the light-emitting layer and a surface of the second electrode facing the light-emitting layer. The first optical cavity structure corresponds to a first wavelength as a peak wavelength, and the first wavelength is longer than a peak wavelength of light emitted from the light-emitting layer. A second optical cavity structure is formed between the surface of the first electrode facing the light-emitting layer and an interface between the first light-transmissive layer and the second light-transmissive layer. The second optical cavity structure corresponds to a second wavelength as a peak wavelength, and the second wavelength is shorter than the first wavelength. The first light-transmissive layer and the second light-transmissive layer differ in refractive index from each other by 0.3 or greater.

According to a light-emitting element pertaining to at least one aspect of the present disclosure, although the first wavelength, which is the peak wavelength corresponding to the first cavity structure formed between the first electrode and the second electrode, is longer than a desired wavelength due to film thickness optimization of the light-emitting layer and a functional layer disposed between the first electrode and the second electrode, the desired wavelength can be obtained as a peak wavelength of light extracted from the light-emitting element owing to the second cavity structure which corresponds to the second wavelength as the peak wavelength which is shorter than the first wavelength. This helps to achieve both optimization in film thickness of the functional layer and extraction of light having a desired wavelength as a peak wavelength from light-emitting element by a combination of two cavity structures, thereby achieving an improvement in efficiency of the light-emitting element emitting light having a desired wavelength as a peak wavelength and thus an increase in operating life of the light-emitting element.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 3A illustrates a comparative example 1 and FIG. 3B illustrates a comparative example 2 in which a functional layer has a greater film thickness than that in the comparative example 1.

FIG. 6A illustrates a state where a TFT layer is formed on a substrate, FIG. 6B illustrates a state where an interlayer insulating layer is formed on the substrate, FIG. 6C illustrates a state where a pixel electrode material layer is formed on the interlayer insulating layer, FIG. 6D illustrates a state where pixel electrodes are formed, and FIG. 6E illustrates a state where a bank material layer is formed on the interlayer insulating layer and the pixel electrodes.

FIG. 7A illustrates a state where banks are formed, FIG. 7B illustrates a state where hole injection layers are formed on the pixel electrodes, FIG. 7C illustrates a state where hole transport layers are formed on the hole injection layers, and FIG. 7D illustrates a state where light-emitting layers are formed on the hole transport layers.

FIG. 8A illustrates a state where an intermediate layer is formed on the light-emitting layers and the banks, FIG. 8B illustrates a state where an electron injection transport layer is formed on the intermediate layer, FIG. 8C illustrates a state where a counter electrode is formed on the electron injection transport layer, and FIG. 8D illustrates a state where a first optical adjustment sublayer is formed on the counter electrode.

FIG. 9A illustrates a state where a second optical adjustment sublayer is formed on the first optical adjustment sublayer, and FIG. 9B illustrates a state where a third optical adjustment sublayer is formed on the second optical adjustment sublayer.

FIG. 10A is a cross-section diagram schematically illustrating a light-emitting element pertaining to at least one embodiment, and FIG. 10B is a cross-section schematically illustrating a self-luminous panel including light-emitting elements pertaining to at least one embodiment.

FIG. 11 is a block diagram illustrating a structure of a display device pertaining to at least one embodiment.

DETAILED DESCRIPTION

Figure 1:
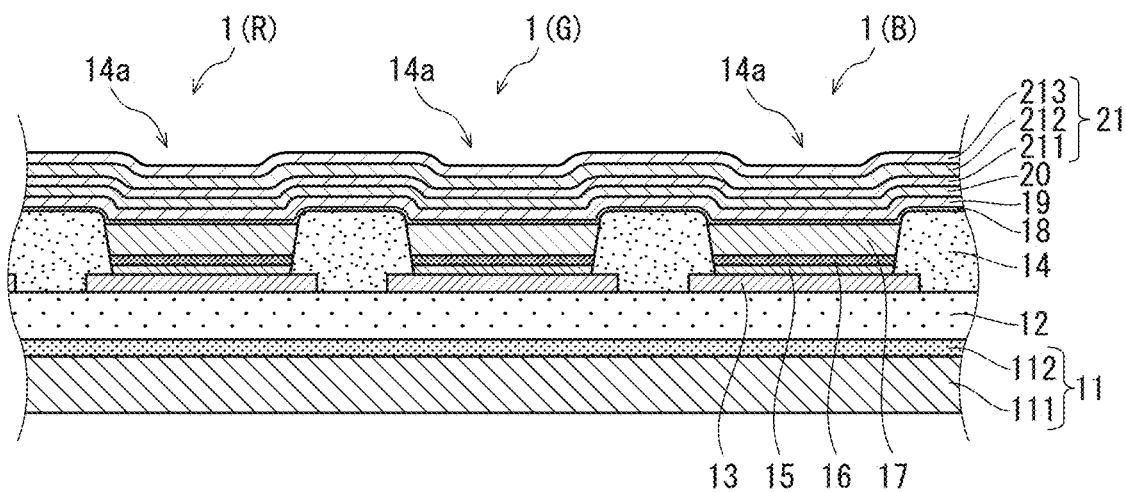
FIG. 1 is a cross-section diagram schematically illustrating a structure of an organic EL element 1 pertaining to at least one embodiment.

«Process by Which One Aspect of the Present Disclosure was Achieved»

As one means for improving the light extraction efficiency of light-emitting elements, optical cavity structures have been known. Specifically, an optical cavity structure is, as illustrated in the schematic cross-section in FIG. 2, a structure in which an optical distance is adjusted such that light intensification occurs between light, traveling along a path $C_1$, which is emitted directly from an emission center inside a light-emitting layer, and light, traveling along a path $C_2$, which is emitted from the emission center and is reflected by a light-transmissive electrode and a light-reflective electrode in this order. Here, a difference in optical path length between the path $C_1$ and the path $C_2$ depends on the sum of an optical path length $L_0$ and an optical path length $L_1$. An optical distance indicates a value obtained by integrating a refractive index by a path length. Conditions for light intensification depends on a relation between a difference in optical path length and a wavelength. The shorter wavelength of emitted light, the shorter an optical path length $L_0+L_1$ needs to be. On the other hand, there is an optimum film thickness for each of light-emitting layers and functional layers other than the light-emitting layer (such as a hole injection layer, a hole transport layer, an electron injection layer, an electron transport layer). In the case where the film thickness of the light-emitting layers and/or the functional layers such as the hole transport layer is not sufficient, functions of these layers might not be sufficiently exhibited, causing deterioration in luminous efficiency. The following problem occurs in particular with respect to elements of shorter light emission wavelengths, such as blue light-emitting elements. Optimization of the cavity structure causes the functional layers to have insufficient film thickness, insufficiently improving the luminous efficiency. In contrast to this, design of the functional layers having sufficient film thickness causes the cavity structure to have the optical path length $L_0+L_1$ which is longer than a desired wavelength to be extracted, causing a shift of a peak wavelength of light to be extracted to longer wavelengths and thus generating a color shift.

In view of the above problem, the inventor has studied on achievement of optimization of both the cavity structure and the film thickness of functional layers. As a result, the inventor arrived at the present disclosure, with an idea of combining a plurality of cavity structures corresponding to different peak wavelengths.

A light-emitting element pertaining to at least one aspect of the present disclosure is a light-emitting element including: a first electrode that is light-reflective; a light-emitting layer disposed above the first electrode; a second electrode that is light-transmissive and is disposed above the light-emitting layer; a first light-transmissive layer disposed on the second electrode; and a second light-transmissive layer disposed on the first light-transmissive layer. A first optical cavity structure is formed between a surface of the first electrode facing the light-emitting layer and a surface of the second electrode facing the light-emitting layer. The first optical cavity structure corresponds to a first wavelength as a peak wavelength, and the first wavelength is longer than a peak wavelength of light emitted from the light-emitting layer. A second optical cavity structure is formed between the surface of the first electrode facing the light-emitting layer and an interface between the first light-transmissive layer and the second light-transmissive layer. The second optical cavity structure corresponds to a second wavelength as a peak wavelength, and the second wavelength is shorter than the first wavelength. The first light-transmissive layer and the second light-transmissive layer differ in refractive index from each other by 0.3 or greater.

According to a light-emitting element pertaining to at least one aspect of the present disclosure, although the first wavelength, which is the peak wavelength corresponding to the first cavity structure formed between the first electrode and the second electrode, is longer than a desired wavelength due to film thickness optimization of the light-emitting layer and a functional layer disposed between the first electrode and the second electrode, the desired wavelength can be obtained owing to the second cavity structure which corresponds to the second wavelength as the peak wavelength which is shorter than the first wavelength. This helps to achieve both optimization in film thickness of the functional layer and extraction of light having a desired wavelength as a peak wavelength from light-emitting element by a combination of two cavity structures, thereby achieving an improvement in luminous efficiency of the light-emitting element emitting light having a desired wavelength as a peak wavelength and thus an increase in operating life of the light-emitting element.

Also, a light-emitting element pertaining to at least one aspect of the present disclosure includes the following structures.

According to at least one aspect of the disclosure, when the first wavelength is denoted by $\lambda_1$, an optical distance from the surface of the first electrode facing the light-emitting layer to an emission center inside the light-emitting layer is denoted by $L_0$, and an optical distance from the emission center to the surface of the second electrode facing the light-emitting layer is denoted by $L_1$, the following relation is satisfied:

$$2(L_0 + L_1) - \frac{\lambda_1(\phi_0 + \phi_1)}{2\pi} = m_1 \lambda_1$$

where $\phi_0$ denotes a phase change of light reflected by the surface of the first electrode facing the light-emitting layer, $\phi_1$ denotes a phase change of light reflected by the surface of the second electrode facing the light-emitting layer, and $m_1$ is any natural number.

This structure helps to extract light having the first wavelength as the peak wavelength by the first cavity structure.

According to at least one aspect of the disclosure, when the second wavelength is denoted by $\lambda_2$, an optical distance from the surface of the first electrode facing the light-emitting layer to an emission center inside the light-emitting layer is denoted by $L_0$, and an optical distance from the emission center to the surface of the second light-transmissive layer facing the light-emitting layer is denoted by $L_2$, the following relation is satisfied:

$$2(L_0 + L_2) - \frac{\lambda_2(\phi_0 + \phi_2)}{2\pi} = m_2 \lambda_2$$

where $\phi_0$ denotes a phase change of light reflected by the surface of the first electrode facing the light-emitting layer, $\phi_2$ denotes a phase change of light reflected by the surface of the second light-transmissive layer facing the light-emitting layer, and $m_2$ is any natural number.

This structure helps to extract of light having the second wavelength as the peak wavelength by the second cavity structure.

According to at least one aspect of the disclosure, the peak wavelength of the light emitted from the light-emitting layer differs from a peak wavelength of light extracted outside the light-emitting element by 15 nm or smaller. The extracted light is obtained by synthesizing light emitted from the first optical cavity structure and light emitted from the second optical cavity structure.

This structure helps to reduce a difference between the peak wavelength of light extracted from the light-emitting element and the peak wavelength of light inside the light-emitting layer, thereby further improving the luminous efficiency of the light-emitting element.

According to at least one aspect of the disclosure, the light-emitting element further includes a third light-transmissive layer that is disposed on the second light-transmissive layer and includes one or more sublayers. A third optical cavity structure is formed between the surface of the first electrode facing the light-emitting layer and a surface of any of the sublayers that are included in the third light-transmissive layer. The surface of the any sublayer faces the light-emitting layer. An optical distance between the surface of the second electrode facing the light-emitting layer and an upper surface of the third light-transmissive layer is 1 µm or smaller.

This structure helps to design in further detail for example the peak wavelength of light extracted from the light-emitting element by the third cavity structure.

According to at least one aspect of the disclosure, the third optical cavity structure is configured to cause attenuation on the peak wavelength of the first optical cavity structure.

This structure helps to reduce the dependence of the light intensity by the first optical cavity structure on the orientation, thereby reducing variation in intensity and peak wavelength of light extracted from the light-emitting element depending on the viewing angle.

According to at least one aspect of the disclosure, the third optical cavity structure corresponds to a third wavelength as a peak wavelength, and the third wavelength is between the first wavelength and the second wavelength.

This structure helps to extract light having, as a peak wavelength, the third wavelength which is closer to the desired peak wavelength even by the third cavity structure, thereby further improving the light extraction efficiency of the light-emitting element.

Also, a light-emitting element pertaining to at least one aspect of the present disclosure is a light-emitting element includes: a first electrode that is light-reflective; a light-emitting layer disposed above the first electrode; a second electrode that is light-transmissive and is disposed above the light-emitting layer; a first light-transmissive layer disposed on the second electrode; and a second light-transmissive layer disposed on the first light-transmissive layer. A first optical cavity structure is formed between a surface of the first electrode facing the light-emitting layer and a surface of the second electrode facing the light-emitting layer. The first optical cavity structure corresponds to a first wavelength as a peak wavelength, and the first wavelength is longer than a peak wavelength of light emitted from the light-emitting layer. A second optical cavity structure is formed between the surface of the first electrode facing the light-emitting layer and an interface between the first light-transmissive layer and the second light-transmissive layer. The second optical cavity structure corresponds to a second wavelength as a peak wavelength, and the second wavelength is shorter than the first wavelength. The first light-transmissive layer includes indium zinc oxide (IZO) or niobium oxide (NbO), and the second light-transmissive layer includes silicon oxynitride (SiON).

Even according to the light-emitting element pertaining to the above aspect, although the first wavelength, which is the peak wavelength corresponding to the first cavity structure formed between the first electrode and the second electrode, is longer than a desired wavelength due to film thickness optimization of the light-emitting layer and a functional layer disposed between the first electrode and the second electrode, the desired wavelength can be obtained owing to the second cavity structure which corresponds to the second wavelength as the peak wavelength which is shorter than the first wavelength. This helps to achieve both optimization in film thickness of the functional layer and extraction of light having a desired wavelength as a peak wavelength from light-emitting element by a combination of two cavity structures, thereby achieving an improvement in luminous efficiency of the light-emitting element emitting light having a desired wavelength as a peak wavelength and thus an increase in operating life of the light-emitting element.

Also, a self-luminous panel pertaining to at least one aspect of the present disclosure is a self-luminous panel including a plurality of light-emitting elements pertaining to at least one aspect of the present disclosure that are formed on a substrate.

This structure helps to achieve a self-luminous panel of a top-emission type which includes light-emitting elements pertaining to at least one aspect of the present disclosure.

Also, a self-luminous panel pertaining to at least one aspect of the present disclosure is a self-luminous panel including a substrate, at least part of which is light-transmissive; a second light-transmissive layer disposed above the light-transmissive part of the substrate; a first light-transmissive layer disposed on the second light-transmissive layer; a second electrode that is light-transmissive and is disposed above the first light-transmissive layer; a light-emitting layer disposed above the second electrode; and a first electrode that is light-reflective and is disposed above the light-emitting layer. A first optical cavity structure is formed between a surface of the first electrode facing the light-emitting layer and a surface of the second electrode facing the light-emitting layer. The first optical cavity structure corresponds to a first wavelength as a peak wavelength, and the first wavelength is longer than a peak wavelength of light emitted from the light-emitting layer. A second optical cavity structure is formed between the surface of the first electrode facing the light-emitting layer and an interface between the first light-transmissive layer and the second light-transmissive layer. The second optical cavity structure corresponds to a second wavelength as a peak wavelength, and the second wavelength is shorter than the first wavelength. The first light-transmissive layer and the second light-transmissive layer differ in refractive index from each other by 0.3 or greater.

This structure helps to achieve a self-luminous panel of a bottom-emission type which includes light-emitting elements pertaining to at least one aspect of the present disclosure.

Also, a self-luminous panel pertaining to at least one aspect of the present disclosure is a self-luminous panel including a substrate, at least part of which is light-transmissive; a second light-transmissive layer disposed above the light-transmissive part of the substrate; a first light-transmissive layer disposed on the second light-transmissive layer; a second electrode that is light-transmissive and is disposed above the first light-transmissive layer; a light-emitting layer disposed above the second electrode; and a first electrode that is light-reflective and is disposed above the light-emitting layer. A first optical cavity structure is formed between a surface of the first electrode facing the light-emitting layer and a surface of the second electrode facing the light-emitting layer. The first optical cavity structure corresponds to a first wavelength as a peak wavelength, and the first wavelength is longer than a peak wavelength of light emitted from the light-emitting layer. A second optical cavity structure is formed between the surface of the first electrode facing the light-emitting layer and an interface between the first light-transmissive layer and the second light-transmissive layer. The second optical cavity structure corresponds to a second wavelength as a peak wavelength, and the second wavelength is shorter than the first wavelength. The first light-transmissive layer includes indium zinc oxide (IZO) or niobium oxide (NbO), and the second light-transmissive layer includes silicon oxynitride (SiON).

This structure helps to achieve a self-luminous panel of a bottom-emission type which includes light-emitting elements pertaining to at least one aspect of the present disclosure.

Also, a method of manufacturing a light-emitting element pertaining to at least one aspect of the present disclosure is a method of manufacturing a light-emitting element, including: forming a first electrode that is light-reflective on a substrate; forming a light-emitting layer above the first electrode; forming a second electrode that is light-transmissive above the light-emitting layer; forming a first light-transmissive layer on the second electrode; and forming a second light-transmissive layer on the first light-transmissive layer. In the forming of the second electrode, a first optical cavity structure is formed between a surface of the first electrode facing the light-emitting layer and a surface of the second electrode facing the light-emitting layer. The first optical cavity structure corresponds to a first wavelength as a peak wavelength, and the first wavelength is longer than a peak wavelength of light emitted from the light-emitting layer. In the forming of the second light-transmissive layer, a second optical cavity structure is formed between the surface of the first electrode facing the light-emitting layer and an interface between the first light-transmissive layer and the second light-transmissive layer. The second optical cavity structure corresponds to a second wavelength as a peak wavelength, and the second wavelength is shorter than the first wavelength. The first light-transmissive layer and the second light-transmissive layer differ in refractive index from each other by 0.3 or greater.

Also, a method of manufacturing a light-emitting element pertaining to at least one aspect of the present disclosure is a method of manufacturing a light-emitting element, including: forming a first electrode that is light-reflective on a substrate; forming a light-emitting layer above the first electrode; forming a second electrode that is light-transmissive above the light-emitting layer; forming a first light-transmissive layer on the second electrode; and forming a second light-transmissive layer on the first light-transmissive layer. In the forming of the second electrode, a first optical cavity structure is formed between a surface of the first electrode facing the light-emitting layer and a surface of the second electrode facing the light-emitting layer. The first optical cavity structure corresponds to a first wavelength as a peak wavelength, and the first wavelength is longer than a peak wavelength of light emitted from the light-emitting layer. In the forming of the second light-transmissive layer, a second optical cavity structure is formed between the surface of the first electrode facing the light-emitting layer and an interface between the first light-transmissive layer and the second light-transmissive layer. The second optical cavity structure corresponds to a second wavelength as a peak wavelength, and the second wavelength is shorter than the first wavelength. The first light-transmissive layer includes indium zinc oxide (IZO) or niobium oxide (NbO), and the second light-transmissive layer includes silicon oxynitride (SiON).

Also, a method of manufacturing a light-emitting element pertaining to at least one aspect of the present disclosure is a method of manufacturing a light-emitting element, including: forming a second light-transmissive layer on a substrate; forming a first light-transmissive layer on the second light-transmissive layer; forming a second electrode that is light-transmissive above the first light-transmissive layer; forming a light-emitting layer above the second electrode;

and forming a first electrode that is light-reflective above the light-emitting layer. In the forming of the second electrode, a first optical cavity structure is formed between a surface of the first electrode facing the light-emitting layer and a surface of the second electrode facing the light-emitting layer. The first optical cavity structure corresponds to a first wavelength as a peak wavelength, and the first wavelength is longer than a peak wavelength of light emitted from the light-emitting layer. In the forming of the second light-transmissive layer, a second optical cavity structure is formed between the surface of the first electrode facing the light-emitting layer and an interface between the first light-transmissive layer and the second light-transmissive layer. The second optical cavity structure corresponds to a second wavelength as a peak wavelength, and the second wavelength is shorter than the first wavelength. The first light-transmissive layer and the second light-transmissive layer differ in refractive index from each other by 0.3 or greater.

Also, a method of manufacturing a light-emitting element pertaining to at least one aspect of the present disclosure is a method of manufacturing a light-emitting element, including: forming a second light-transmissive layer on a substrate; forming a first light-transmissive layer on the second light-transmissive layer; forming a second electrode that is light-transmissive above the first light-transmissive layer; forming a light-emitting layer above the second electrode; and forming a first electrode that is light-reflective above the light-emitting layer. In the forming of the second electrode, a first optical cavity structure is formed between a surface of the first electrode facing the light-emitting layer and a surface of the second electrode facing the light-emitting layer. The first optical cavity structure corresponds to a first wavelength as a peak wavelength, and the first wavelength is longer than a peak wavelength of light emitted from the light-emitting layer. In the forming of the second light-transmissive layer, a second optical cavity structure is formed between the surface of the first electrode facing the light-emitting layer and an interface between the first light-transmissive layer and the second light-transmissive layer. The second optical cavity structure corresponds to a second wavelength as a peak wavelength, and the second wavelength is shorter than the first wavelength. The first light-transmissive layer includes indium zinc oxide (IZO) or niobium oxide (NbO), and the second light-transmissive layer includes silicon oxynitride (SiON).

Embodiments

The following describes at least one embodiment of a self-luminous panel including light-emitting elements pertaining to the present disclosure. Note the following description is just an example for simply explaining the structures and actions and effects pertaining to one aspect of the present disclosure. The present disclosure is not limited to at least one embodiment below except for essential part of the present disclosure. Also, in the present description including the following description and the claims, the terms top, bottom, upper, lower, and the like indicate the positional relationship relative to the light emission direction, and this positional relationship does not necessarily coincide with the absolute positional relationship in the vertical direction.

1. Structure of Organic EL elements

FIG. 1 is a partial cross-section diagram of an organic EL display panel 100 (see FIG. 11) as a self-luminous panel pertaining to at least one embodiment. The organic EL display panel 100 includes a plurality of pixels each constituted from organic EL elements 1(R), 1(G), and 1(B) respectively emitting light of red, green, and blue colors. In other words, the organic EL elements 1(R), 1(G), and 1(B) are each a subpixel, and a group of organic EL elements each emitting light of a different color is a pixel. The cross-section of such one pixel is illustrated in FIG. 1.

The organic EL display panel 100 is of a so-called top-emission type according to which the organic EL elements 1 each emit light forward (upward in FIG. 1).

The organic EL elements 1(R), 1(G), and 1(B) have substantially the same structure, and thus are referred collectively to as organic EL elements 1 when they are not distinguished from one another.

As illustrated in FIG. 1, the organic EL element 1 each include a substrate 11, an interlayer insulating layer 12, a pixel electrode 13, a bank 14, a hole injection layer 15, a hole transport layer 16, a light-emitting layer 17, an intermediate layer 18, an electron injection transport layer 19, a counter electrode 20, and an optical adjustment layer 21. The optical adjustment layer 21 includes a first optical adjustment sublayer 211, a second optical adjustment sublayer 212, and a third optical adjustment sublayer 213 that are formed on the counter electrode 20 in this order. The pixel electrode 13 and the counter electrode 20 respectively correspond to a first electrode and a second electrode of the present disclosure. Also, the first optical adjustment sublayer 211 and the second optical adjustment sublayer 212 respectively correspond to a first light-transmissive layer and a second light-transmissive layer of the present disclosure.

The substrate 11, the interlayer insulating layer 12, the intermediate layer 18, the electron injection transport layer 19, the counter electrode 20, the first optical adjustment sublayer 211, the second optical adjustment sublayer 212, and the third optical adjustment sublayer 213 are formed not for each pixel but for the entire organic EL elements 1 included in the organic EL display panel 100.

<Substrate>

The substrate 11 includes a base material 111 which is an insulating material and a thin film transistor (TFT) layer 112. The TFT layer 112 has a driving circuit formed therein for each subpixel. The base material 111 is for example a glass substrate, a quartz substrate, or a plastic substrate. Either thermoplastic resin or thermosetting resin is usable as a plastic material of the base material. The plastic material is for example a single layer of any one type of the following resin materials or a laminate of any two or more types of the following materials selected so as to be resistant against the process temperature. Examples of the resin materials include polyimide (PI), polyeter imide (PEI), polysulfone (PSU), polycarbonate (PC), polyethylene terephthalate (PET), polyethylene naphthalate (PEN), polybutylene terephthalate, thermoplastic elastomer such as styrene elastomer, polyolefin elastomer, and polyurethane elastomer, epoxy resin, unsaturated polyester resin, silicone resin, polyurethane resin, and copolymer, blend, polymer alloy and the like including such a material as a main component.

<Interlayer Insulating Layer>

The interlayer insulating layer 12 is formed on the substrate 11. The interlayer insulating layer 12 includes a resin material and is for flattening unevenness on a top surface of the TFT layer 112. The resin material is for example a positive photosensitive material. Examples of the photosensitive material include acrylic resin, polyimide resin, siloxane resin, and phenolic resin. Also, although not shown in the cross-section in FIG. 1, the interlayer insulating layer 12 has a contact hole provided therein for each subpixel.

<Pixel Electrodes>

The pixel electrodes 13 are formed on the interlayer insulating layer 12. The pixel electrode 13 is formed for each subpixel, and is electrically connected with the TFT layer 112 via a corresponding contact hole provided in the interlayer insulating layer 12.

In the present embodiment, the pixel electrode 13 functions as a light-reflective anode.

Specific examples of a light-reflective metal material include silver (Ag), aluminum (Al), alloy of aluminum, molybdenum (Mo), alloy of silver, palladium, and copper (APC), alloy of silver, rubidium, and gold (ARA), alloy of molybdenum and chromium (MoCr), alloy of molybdenum and tungsten (MoW), and alloy of nickel and chromium (NiCr).

In at least one embodiment, the pixel electrodes 13 have a single-layer structure of a metal layer. In at least one embodiment, the pixel electrodes 13 have a multi-layer structure including a metal oxide layer such as an indium tin oxide (ITO) layer and an indium zinc oxide (IZO) layer layered on a metal layer.

<Banks>

The banks 14 are formed on the pixel electrodes 13 so as to expose partial regions of top surfaces of the pixel electrodes 13 and cover peripheral regions of the partial regions. The partial regions of the top surfaces of the pixel electrodes 13 which are not covered by the banks 14 (hereinafter, referred to as apertures) correspond to subpixels. In other words, the banks 14 each have an aperture 14a provided for each subpixel.

In the present embodiment, where the pixel electrodes 13 are not formed, the banks 14 are formed on the interlayer insulating layer 12. In other words, where the pixel electrodes 13 are not formed, bottom surfaces of the banks 14 are in contact with a top surface of the interlayer insulating layer 12.

The banks 14 include for example an insulating organic material such as acrylic resin, polyimide resin, novolac resin, and phenolic resin. In the case where the light-emitting layers 17 are formed by ink application, the banks 14 function as a structure for preventing overflow of an applied ink. Meanwhile, in the case where the light-emitting layers 17 are formed by vapor deposition, the banks 14 function as a structure for placing a vapor deposition mask. In the present embodiment, the banks 14 include a resin material. The material of the banks 14 is for example acrylic resin, polyimide resin, siloxane resin, or phenolic resin. In the present embodiment, phenolic resin is used.

<Hole Injection Layers>

The hole injection layers 15 are provided on the pixel electrodes 13 in order to promote injection of holes from the pixel electrodes 13 to the light-emitting layers 17. Specific examples of material of the hole injection layers 15 include an electrically-conductive polymer material such as PEDOT/PSS (mixture of polythiophene and polystyrene sulfonate).

In at least one embodiment, the hole injection layers 15 include transition metal oxide. Specific examples of transition metal include silver (Ag), molybdenum (Mo), chromium (Cr), vanadium (V), tungsten (W), nickel (Ni), and iridium (Ir). The reason why transition metal oxide is used is that transition metal has a plurality of oxidation numbers and this facilitates hole injection thereby to contribute to reduction in driving voltage. In this case, the hole injection layers 15 have a high work function.

In at least one embodiment, the hole injection layers 15 have a multi-layer structure including an electrically-conductive polymer material layered on transition metal oxide.

<Hole Transport Layers>

The hole transport layers 16 have a function of transporting holes injected from the hole injection layers 15 to the light-emitting layers 17. The hole transport layers 16 include an organic material having a high hole mobility in order to efficiently transport holes from the hole injection layers 15 to the light-emitting layers 17. The hole transport layers 16 are formed by applying and drying a solution of an organic material. The organic material of the hole transport layers 16 is for example a high-molecular compound such as polyfluorene, polyfluorene derivative, polyallylamine, and polyallylamine derivative.

In at least one embodiment, the hole transport layers 16 include triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styrylanthracene derivative, fluorenone derivative, hydrazone derivative, stilbene derivative, porphyrin compound, aromatic tertiary amine compound and styrylamine compound, butadiene compound, polystyrene derivative, hydrazone derivative, triphenylmethane derivative, or tetraphenylbenzene derivative. In at least one embodiment, the hole transport layers 16 include porphyrin compound, aromatic tertiary amine compound, styrylamine compound, or the like. In this case, the hole transport layers 16 are formed by vacuum deposition. The material and the method for manufacturing the hole transport layers 16 are not limited to those described above. In at least one embodiment, the hole transport layers 16 are formed by using any material having a hole transport function and any manufacturing method usable for manufacturing the hole transport layers 16.

<Light-Emitting Layers>

The light-emitting layers 17 are formed inside the apertures 14a. The light-emitting layers 17 have a function of emitting light of R, G, and B colors owing to recombination of holes and electrons. Publicly-known materials are usable for a material of the light-emitting layers 17.

In the case where the light-emitting elements 1 are organic EL elements, examples of an organic light-emitting material of the light-emitting layers 17 include phosphor such as oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, and metal complex of 8-hydroxyquinoline compound, metal complex of 2-bipyridine compound, complex of a Schiff base and group III metal, oxine metal complex, and rare earth complex. In at least one embodiment, the organic light-emitting material of the light-emitting layers 17 is a known phosphorescent substance, for example, metal complex such as tris (2-phenylpyridine) iridium. In at least one embodiment, the light-emitting layers 17 include a high-molecular compound such as polyfluorene, polyfluorene derivative, polyallylamine, and polyallylamine derivative, or include a mixture of a low-molecular compound and the high-molecular compound. In at least one embodiment, the organic EL elements 1 are QLEDs, and material having quantum dot effects is used as the material of the light-emitting layers 17.

<Intermediate Layer>

The intermediate layer 18 is formed on the light-emitting layers 17 and includes fluoride or quinolinium complex of a metal material having an electron injection property. The metal material is selected from alkali metal or alkaline earth metal. The alkali metal specifically includes lithium (Li), sodium (Na), potassium (K), rubidium (Rb), cesium (Cs), and furansium (Fr). Also, the alkaline earth metal specifically includes calcium (Ca), strontium (Sr), barium (Ba), and radium (Ra). In the present embodiment, the intermediate layer 18 includes sodium fluoride (NaF).

<Electron Injection Transport Layer>

The electron injection transport layer 19 is formed on the intermediate layer 18, and includes an organic material having an electron transport property that is doped with a metal material improving an electron injection property. Here, doping indicates dispersion of metal atoms or metal ions of a metal material into an organic material in a substantially uniform manner, and specifically indicates formation of a single phase including an organic material and a minute amount of a metal material. In at least one embodiment, other phase is not present, specifically such as a phase only including a metal material, for example a metal piece or a metal film, and a phase including a metal material as a main component. Also, in at least one embodiment, a single phase which includes an organic material and a minute amount of a metal material has metal atoms or metal ions at uniform concentrations, and such a single phase has metal atoms or metal ions that do not cohere together. In at least one embodiment, the metal material is selected from rare earth metals. Also, in at least one embodiment, ytterbium (Yb) is selected for the metal material. In the present embodiment, Yb is selected for the metal material. Also, in at least one embodiment, a doping amount of the metal material in the electron injection transport layer 19 is 3 wt % to 60 wt %. In the present embodiment, the doping amount of the metal material is 20 wt %.

The organic material having an electron transport property is for example a π-electron low molecular organic material such as oxadiazole derivative (OXD), triazole derivative (TAZ), and phenanthroline derivative (BCP, Bphen).

<Counter Electrode>

The counter electrode 20 includes a light-transmissive and electrically-conductive material and is formed on the electron injection transport layer 19. In the present embodiment, the counter electrode 20 functions as a cathode.

A cavity structure is formed between a pair of a light-reflective surface of an interface of the counter electrode 20 with the electron injection transport layer 19 and light-reflective surfaces of interfaces of the pixel electrodes 13 with the hole injection layers 15. Accordingly, light emitted from the light-emitting layers 17, when entering the counter electrode 20 from the electron injection transport layer 19, needs to be partially reflected toward the electron injection transport layer 19. Accordingly, in at least one embodiment, the counter electrode 20 and the electron injection transport layer 19 differ in refractive indices from each other. Thus, in at least one embodiment, the counter electrode 20 is a metal thin film. The metal layer has a film thickness of approximately 1 nm to 50 nm so as to exhibit light-transmissivity.

Examples of the material of the counter electrode 20 include Ag, Ag alloy mainly containing Ag, Al, and Al alloy mainly containing Al. Examples of Ag alloy include magnesium-silver alloy (MgAg) and indium-silver alloy. Ag basically has a low resistivity. Ag alloy has excellent heat resistance and corrosion resistance. Accordingly, in at least one embodiment, Ag and Ag alloy are usable owing to their capabilities of keeping an excellent electric conductivity in a long time. Examples of Al alloy include magnesium-aluminum alloy (MgAl) and lithium-aluminum alloy (LiAl). Other alloys are also usable such as lithium-magnesium alloy and lithium-indium alloy. In the present embodiment, the counter electrode 20 is an Ag thin film.

<First Optical Adjustment Sublayer>

The first optical adjustment sublayer 211 incudes a light-transmissive material and is formed on the counter electrode 20.

A cavity structure is formed between a pair of a light-reflective surface of an interface of the first optical adjustment sublayer 211 with the second optical adjustment sublayer 212 and the light-reflective surfaces of the interfaces of the pixel electrodes 13 with the hole injection layers 15. Accordingly, light emitted from the light-emitting layers 17, when entering the second optical adjustment sublayer 212 from the first optical adjustment sublayer 211, needs to be partially reflected toward the first optical adjustment sublayer 211. Accordingly, in at least one embodiment, the first optical adjustment sublayer 211 and the second optical adjustment sublayer 212 differ in refractive index from each other. In at least one embodiment, respective materials of the first optical adjustment sublayer 211 and the second optical adjustment sublayer 212 are selected such that the difference in refractive index between the first optical adjustment sublayer 211 and the second optical adjustment sublayer 212 is 0.3 or greater.

Examples of the material of the first optical adjustment sublayer 211 include ITO, IZO, zinc oxide (ZnO), niobium oxide (NbO), titanium oxide (TiO), a mixed material of niobium oxide and titanium oxide, gallium oxide (GaO), molybdenum oxide (MoO), tantalum oxide (TaO), a mixed material of titanium oxide and zinc oxide, a mixed material of zinc oxide, gallium oxide, and silicon oxide (SiO), and a mixed material of tin oxide (SnO) and silicon oxide. In at least one embodiment, niobium oxide is usable particularly owing to its high refractive index. In the present embodiment, the first optical adjustment sublayer 211 includes niobium oxide. Note that the first optical adjustment sublayer 211 does not need to be electrically-conductive because of being located on the opposite side of the counter electrode 20 from the pixel electrodes 13. However, in at least one embodiment, the first optical adjustment sublayer 211 having an electrical conductivity is usable in terms of its capability of reducing the sheet resistance of the counter electrode 20.

<Second Optical Adjustment Sublayer>

The second optical adjustment sublayer 212 incudes a light-transmissive material and is formed on the first optical adjustment sublayer 211.

A cavity structure is formed between a pair of a light-reflective surface which is an interface of the first optical adjustment sublayer 211 with the second optical adjustment sublayer 212 and the light-reflective surfaces which are the interfaces of the pixel electrodes 13 with the hole injection layers 15. Accordingly, light emitted from the light-emitting layers 17, when entering the second optical adjustment sublayer 212 from the first optical adjustment sublayer 211, needs to be partially reflected toward the first optical adjustment sublayer 211. Accordingly, in at least one embodiment, the first optical adjustment sublayer 211 and the second optical adjustment sublayer 212 differ in refractive index from each other. In at least one embodiment, respective materials of the first optical adjustment sublayer 211 and the second optical adjustment sublayer 212 are selected such that the difference in refractive index between the first optical adjustment sublayer 211 and the second optical adjustment sublayer 212 is 0.3 or greater.

Examples of material of the second optical adjustment sublayer 212 include silicon oxynitride (SiON) and silicon nitride (SiN). In at least one embodiment, the second optical adjustment sublayer 212 include a resin material such as acrylic resin and silicone resin. For example, in the case where the material of the first optical adjustment sublayer 211 is IZO or niobium oxide, silicon oxynitride is usable as the material of the second optical adjustment sublayer 212. In the present embodiment, the second optical adjustment sublayer 212 includes silicon oxynitride. The combination of the first optical adjustment sublayer 211 and the second optical adjustment sublayer 212 is not limited to the above one. In at least one embodiment, the first optical adjustment sublayer 211 and the second optical adjustment sublayer 212 differ in refractive index from each other.

<Third Optical Adjustment Sublayer>

The third optical adjustment sublayer 213 incudes a light-transmissive material and is formed on the second optical adjustment sublayer 212.

The third optical adjustment sublayer 213 functions as a sealing layer which protects the second optical adjustment sublayer 212. In at least one embodiment, a cavity structure is formed between a pair of an interface between the second optical adjustment sublayer 212 and the third optical adjustment sublayer 213 and the light-reflective surfaces of the interfaces of the pixel electrodes 13 with the hole injection layers 15. Examples of material of the third optical adjustment sublayer 213 include silicon oxynitride (SiON) and silicon nitride (SiN). In at least one embodiment, the third optical adjustment sublayer 213 includes a resin material such as acrylic resin and silicone resin. In the present embodiment, the third optical adjustment sublayer 213 includes silicon oxynitride.

<Others>

In at least one embodiment, a color filter or an upper substrate is attached onto the third optical adjustment sublayer 213 via a sealing resin, although not illustrated in FIG. 1. Adhesion of such an upper substrate helps to prevent the hole transport layers 16, the light-emitting layers 17, the intermediate layer 18, and the electron injection transport layer 19 against moisture, air, and so on.

2. Optical Cavity Structure (2.1) Details of Optical Cavity Structure

Figure 2:
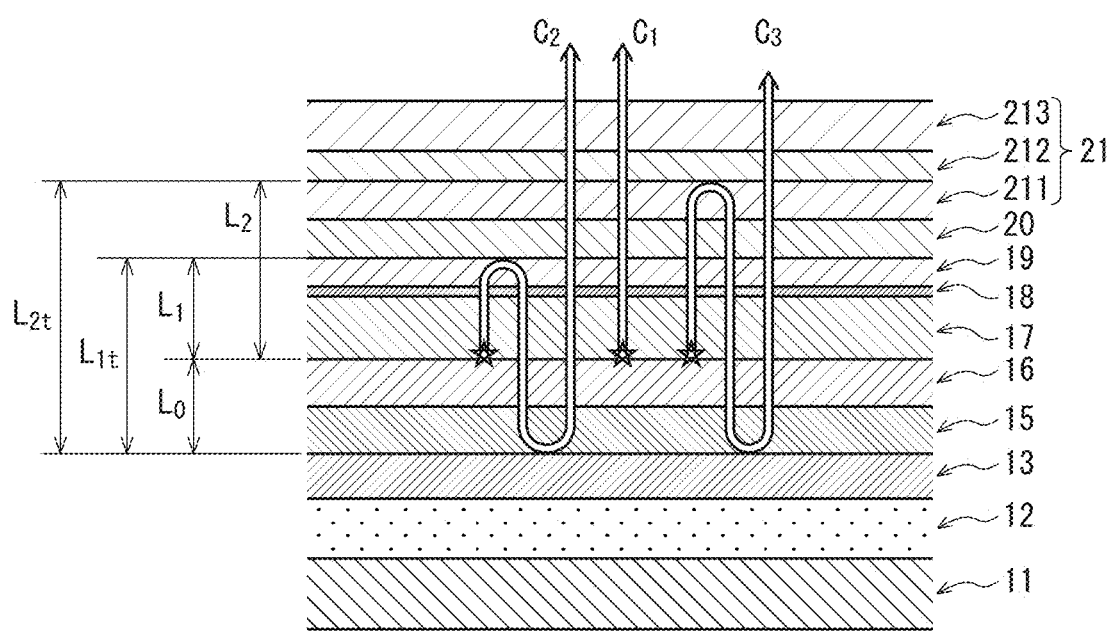
FIG. 2 is a schematic cross-section diagram explaining optical interferences in optical cavity structures formed in an organic EL element 1 pertaining to at least one embodiment.

FIG. 2 is a diagram explaining optical interference in an optical cavity structure of the organic EL elements 1 pertaining to the present embodiment. A first optical cavity structure is formed between the surfaces of the pixel electrodes 13 facing the hole injection layers 15 and the surface of the counter electrode 20 facing the electron injection transport layer 19. Also, a second optical cavity structure is formed between the surfaces of the pixel electrodes 13 facing the hole injection layers 15 and the surface of the second optical adjustment sublayer 212 facing the first optical adjustment sublayer 211. The light-emitting layers 17 are located inside the first cavity structure and inside the second cavity structure.

FIG. 2 illustrates a main path of light emitted from the light-emitting layers 17. The path $C_1$ is a path along which light emitted from the light-emitting layers 17 toward the counter electrode 20 transmits through the counter electrode 20 without being reflected. The path $C_2$ is a path along which light emitted from the light-emitting layers 17 toward the counter electrode 20 is reflected by the surface of the counter electrode 20 facing the electron injection transport layer 19, and is further reflected by the surfaces of the pixel electrodes 13 facing the hole injection layers 15, and then transmits through the light-emitting layers 17 and the counter electrode 20. The path $C_3$ is a path along which light emitted from the light-emitting layers 17 toward the counter electrode 20 transmits through the counter electrode 20 and is reflected by the second optical adjustment sublayer 212 facing the first optical adjustment sublayer 211, and is further reflected by the surfaces of the pixel electrodes 13 facing the hole injection layers 15, and then transmits through the light-emitting layers 17, the counter electrode 20, and the second optical adjustment sublayer 212. In the first cavity structure, interference occurs between light emitted along the path $C_1$ and light emitted along the path $C_2$. In the second cavity structure, interference occurs between light emitted along the path $C_1$ and light emitted along the path $C_3$. Thus, the light emitted by the first cavity structure and the light emitted by the second cavity structure are synthesized with each other so as to be light emitted from the organic EL elements 1.

A difference in optical distance between the path $C_1$ and the path $C_2$ corresponds to an optical film thickness $L_{1t}$ which is the sum of the optical film thickness $L_0$ and the optical film thickness $L_1$ illustrated in FIG. 2. Here, the optical film thickness indicates a value obtained by integrating the refractive index of the film by the film thickness. More specifically, the optical film thickness $L_{1t}$ is the sum of all of the following: the refractive index of the hole injection layers 15×the film thickness of the hole injection layers 15; the refractive index of the hole transport layers 16×the film thickness of the hole transport layers 16; the refractive index of the light-emitting layers 17×the film thickness of the light-emitting layers 17; the refractive index of the intermediate layer 18×the film thickness of the intermediate layer 18; and the refractive index of the electron injection transport layer 19×the film thickness of the electron injection transport layer 19. Similarly, a difference in optical distance between the path $C_1$ and the path $C_3$ corresponds to an optical film thickness $L_{2t}$ which is the sum of the optical film thickness $L_0$ and the optical film thickness $L_2$ illustrated in FIG. 2.

In the first cavity structure, the optical film thickness $L_{1t}$ is set such that light intensification occurs between light emitted along the path $C_1$ and light emitted along the path $C_2$. Furthermore, in the second cavity structure, the optical film thickness $L_{2t}$ is set such that light intensification occurs between light emitted along the path $C_1$ and light emitted along the path $C_3$. Here, when the peak wavelength (wavelength in the vacuum, the same applies to the present description and the claims) of light emitted from the counter electrode 20 obtained in the first cavity structure is denoted by $\lambda_1$, the following relation is satisfied between the peak wavelength and the optical distance.

$$2(L_0 + L_1) - \frac{\lambda_1(\phi_0 + \phi_1)}{2\pi} = m_1\lambda_1 \quad \text{(Formula 1)}$$

Here, $\phi_0$ denotes a phase change of light reflected by the surfaces of the pixel electrode 13 facing the hole injection layers 15, and $\phi_1$ denotes a phase change of light reflected by the surface of the counter electrode 20 facing the electron injection transport layer 19. Also, $m_1$ is any natural number.

Similarly, when the peak wavelength of light emitted from the second optical adjustment sublayer 212 obtained in the second cavity structure is denoted by $\lambda_2$, the following relation is satisfied between the peak wavelength and the optical distance.

$$2(L_0 + L_2) - \frac{\lambda_2(\phi_0 + \phi_2)}{2\pi} = m_2\lambda_2 \quad \text{(Formula 2)}$$

Here, $\phi_2$ denotes a phase change of light reflected by the second optical adjustment sublayer 212 facing the first optical adjustment sublayer 211. Also, $m_2$ is any natural number.

In the organic EL elements 1 pertaining to the present embodiment, the following relation is satisfied with respect to: the peak wavelength $\lambda_1$ corresponding to the first cavity structure; the peak wavelength $\lambda_2$ corresponding to the second cavity structure; the peak wavelength $\lambda_s$ of light extracted from the light-emitting elements 1; and the peak wavelength $\lambda$ of light emitted inside the light-emitting layers 17.

$$\lambda_2 < \lambda_s < \lambda_1 \quad \text{(Formula 3)}$$

By satisfying Formula 3, although the peak wavelength $\lambda_1$ corresponding to the first cavity structure is longer than the peak wavelength $\lambda_s$ of light extracted from the light-emitting elements 1, light having the peak wavelength as a desired wavelength can be extracted from the light-emitting elements 1.

Also, in the light-emitting elements 1 pertaining to the present embodiment, the following relations are satisfied.

$$\lambda - 15 \text{ nm} < \lambda_s < \lambda + 15 \text{ nm} \quad \text{(Formula 4)}$$

$$\lambda_s - 20 \text{ nm} < \lambda_1 \quad \text{(Formula 5)}$$

$$\lambda_2 < \lambda_s + 20 \text{ nm} \quad \text{(Formula 6)}$$

By satisfying Formula 4, most of light extracted from the light-emitting layers 17 can be light extracted from the light-emitting elements 1. This improves the luminous efficiency of the light-emitting elements 1. Further, by satisfying Formulae 5 and 6, light extracted from the light-emitting layers 17 can be extracted efficiently by the first cavity structure and the second cavity structure. This is effective in improving the luminous efficiency and the light extraction efficiency of the light-emitting elements 1.

(2.2) Details of Optical Cavity Structure

Figure 3A:
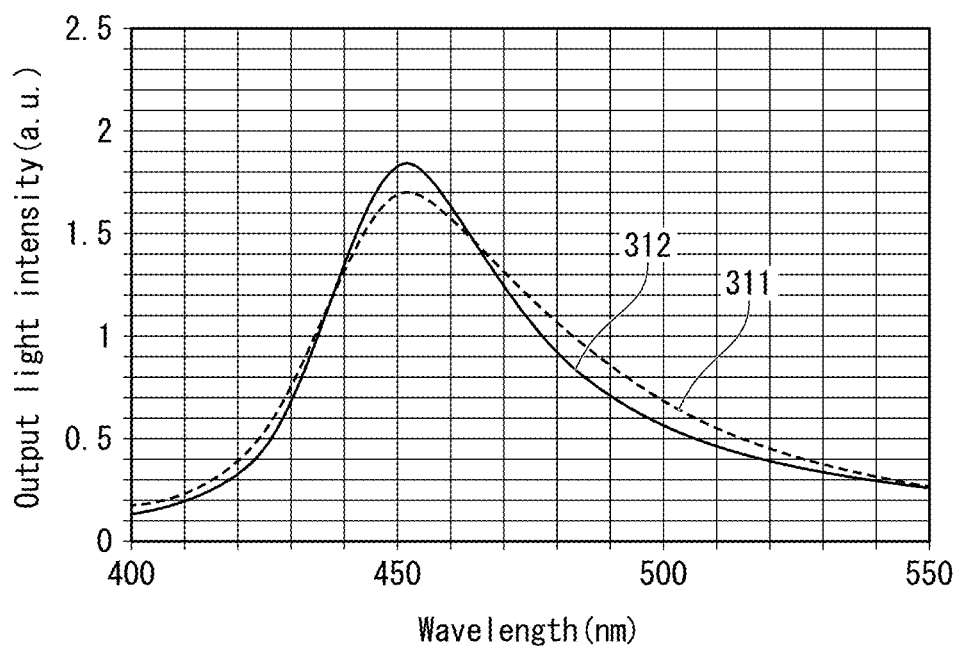
FIGS. 3A and 3B are graphs illustrating spectrum of light output from a first cavity structure and spectrum of light output from an organic EL element in comparative examples, where
Figure 3B:
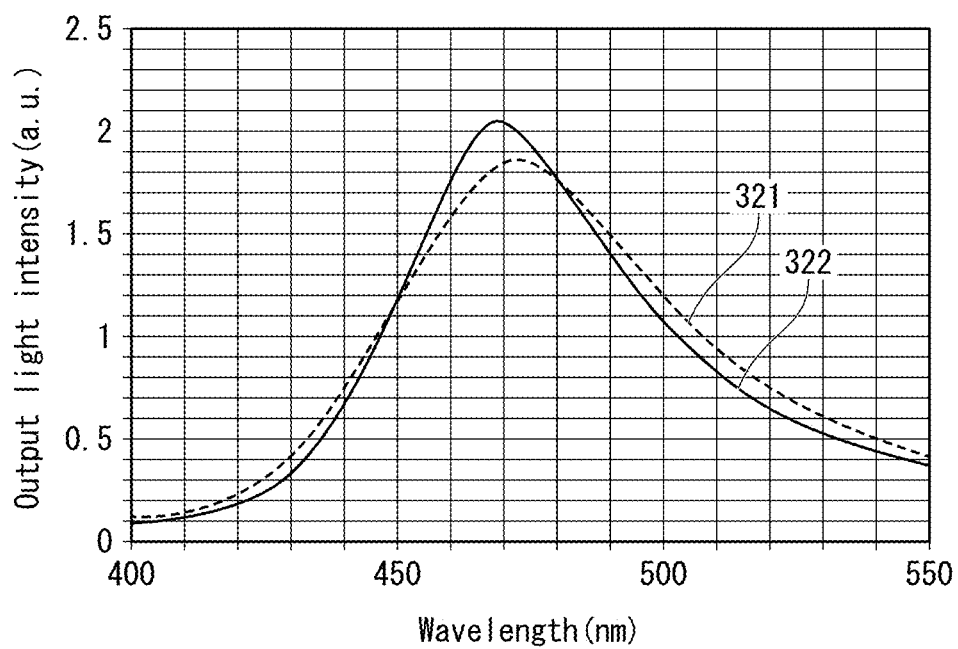
Figure 4A:
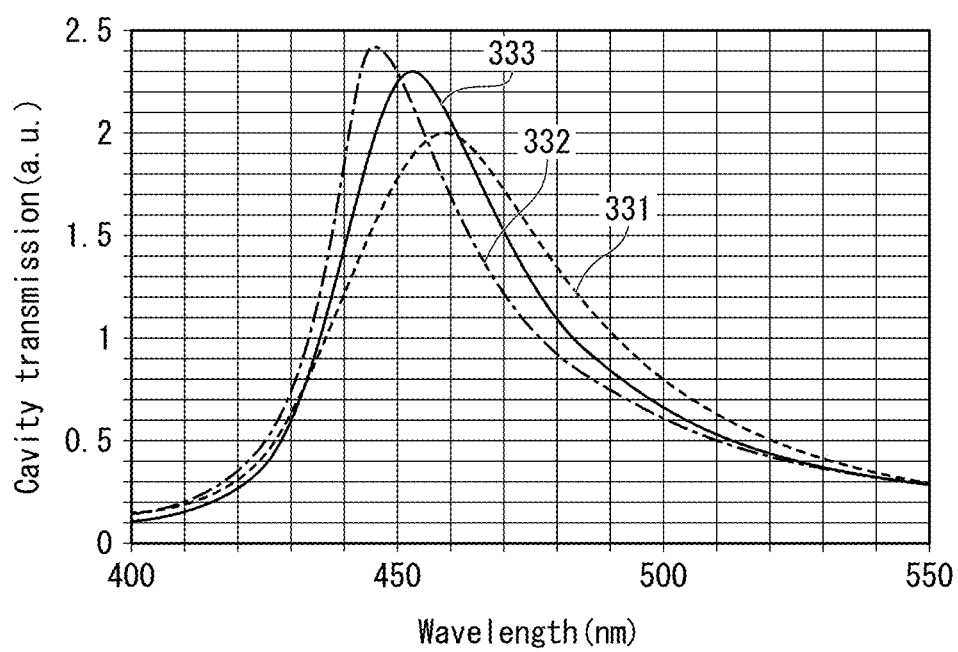
FIG. 4A is a graph illustrating spectrum of light output from a first cavity structure and spectrum of light output from an organic EL element pertaining to at least one embodiment.

FIG. 4A is a schematic diagram of the effect of the optical cavity structure pertaining to the present embodiment. FIGS. 3A and 3B are schematic diagrams of the effect of optical cavity structures pertaining to comparative examples.

FIG. 3A is a schematic diagram of luminescence spectrum, as a comparative example 1, according to a conventional structure of $\lambda_1 = \lambda_2$, where spectrum 311 indicates spectrum of light output from a first cavity structure and spectrum 312 indicates spectrum of light output from light-emitting elements. Meanwhile, FIG. 3B is a schematic diagram of luminescence spectrum, as a comparative example 2, of light-emitting elements including hole transport layers 16 and light-emitting layers 17 which have increased film thicknesses relative to those in the comparative example 1, where spectrum 321 indicates spectrum of light output from a first cavity structure, and spectrum 322 indicates spectrum of light output from the light-emitting elements. The film thickness of the light-emitting layers 17 in the comparative example 2 is greater by 8 nm than that in the comparative example 1, and thus optical film thicknesses $L_0$ and $L_1$ in the comparative example 2 are greater than those in the comparative example 1. Thus, peak wavelengths $\lambda_1$ and $\lambda_2$ in the comparative example both are longer than those in the comparative example 1. More specifically, the peak wavelength $\lambda_s$ in the comparative example 1 is approximately 450 nm, whereas the peak wavelength $\lambda_s$ in the comparative example 2 is approximately 470 nm. Consequently, in the case where a desired wavelength of light to be extracted from light-emitting elements is 450 nm in the comparative example 2, the following problem occurs. In order to increase the film thicknesses of the hole transport layers 16, the light-emitting layers 17, etc. with no variation of the optical film thickness $L_{1r}$, it is necessary to reduce the film thickness of the electron injection transport layer 19. Thus, it is difficult to achieve both optimization in film thickness of each functional layer and structure of extracting light having a desired wavelength by the optical cavity structure.

Compared with this, FIG. 4A is a schematic diagram of the luminescence spectrum pertaining to the present embodiment, where spectrum 331 indicates spectrum of light output from the first cavity structure, spectrum 332 indicates spectrum of light output from the second cavity structure, and spectrum 333 indicates spectrum of light output from the light-emitting elements. Similarly to the comparative example 2, the light-emitting elements pertaining to the present embodiment include the hole transport layers 16, the light-emitting layers 17, etc. which have increased film thicknesses relative to those in the comparative example 1. Accordingly, similarly to the comparative example 2, the peak wavelength $\lambda_1$ corresponding to the first cavity structure, which is determined by the optical film thicknesses $L_0$ and $L_1$, pertaining to the present embodiment, exists in longer wavelengths compared to that in the comparative example 1. However, in the present embodiment, the optical film thickness $L_2$ is designed such that the peak wavelength $\lambda_2$ corresponding to the second cavity structure satisfies the above relation with respect to the peak wavelength $\lambda_s$ of light extracted from the light-emitting elements 1, namely, the relation $\lambda_2 < \lambda_s$. Accordingly, the spectrum 333 of light output from the light-emitting lights satisfies the relation $\lambda_2 < \lambda_s < \lambda_1$, and thus although the peak wavelength $\lambda_1$ is longer than a desired wavelength of light to be extracted from the light-emitting elements, light having the desired wavelength can be extracted.

Figure 4B:
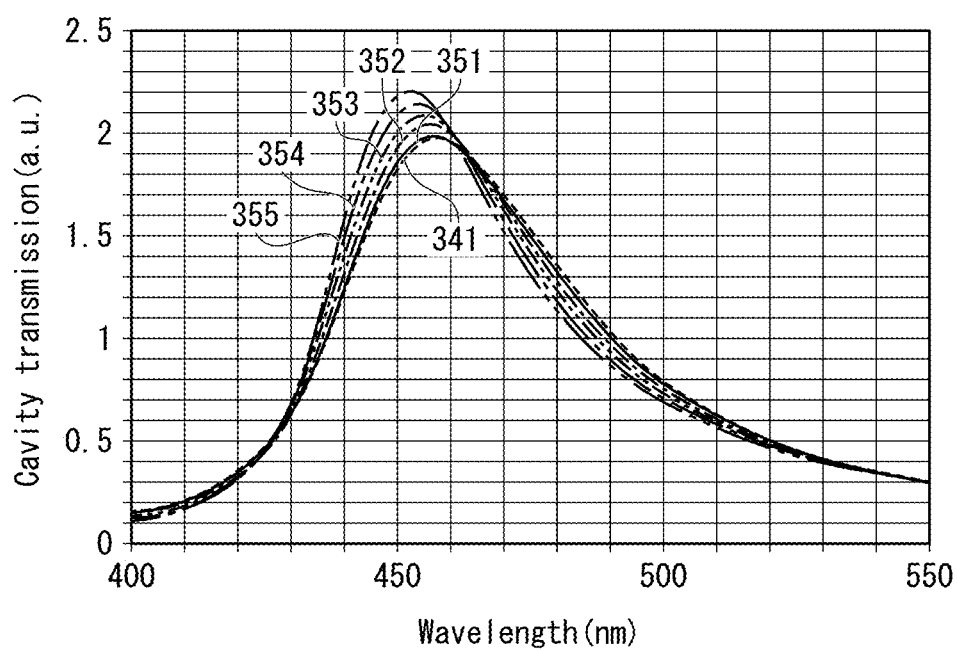
FIG. 4B is a graph illustrating an influence of a difference in refractive index between a first optical adjustment sublayer and a second optical adjustment sublayer exerting on spectrum of light output from an organic EL element.

FIG. 4B is a schematic diagram of a relation between the difference in refractive index between the first optical adjustment sublayer 211 and the second optical adjustment sublayer 212, and the spectrum of light output from the light-emitting elements. In the figure, spectrum 341 indicates spectrum of light output from the first cavity structure. Spectra 351 to 355 indicate spectra of light output from the light-emitting elements, and respectively correspond to the differences in refractive index of 0.13, 0.30, 0.46, 0.63, and 0.79 between the first optical adjustment sublayer 211 and the second optical adjustment sublayer 212. As illustrated in FIG. 4B, as the difference in refractive index between the first optical adjustment sublayer 211 and the second optical adjustment sublayer 212 increases, the peak wavelength of light output from the light-emitting elements shifts to shorter wavelengths. The reason for this is considered as follows: as the difference in refractive index increases between the first optical adjustment sublayer 211 and the second optical adjustment sublayer 212, light reflectance increases at the interface between the first optical adjustment sublayer 211 and the second optical adjustment sublayer 212 thereby to increase light output from the second cavity structure. As illustrated in FIG. 4B, it is preferable that the difference in refractive index between the first optical adjustment sublayer 211 and the second optical adjustment sublayer 212 is greater. In at least one embodiment, the difference in refractive index between the first optical adjustment sublayer 211 and the second optical adjustment sublayer 212 is for example 0.30 or greater.

3. Summary of Optical Cavity Structure

According to the light-emitting elements pertaining to the present embodiment, as described above, the peak wavelength of extracted light differs between the first cavity structure, which is formed between the pixel electrodes and the counter electrode, and the second cavity structure, which is formed between the pixel electrodes and the second optical adjustment sublayer. Thus, the peak wavelength corresponding to the first cavity structure is designed so as to be longer than the desired peak wavelength of light to be extracted from the light-emitting elements, and the peak wavelength corresponding to the second cavity structure is designed so as to be shorter than the desired peak wavelength of light to be extracted from the light-emitting elements. This helps to increase the film thickness of the functional layer without shifting the peak wavelength of light extracted from the light-emitting elements to longer wavelengths. This helps to improve the luminous efficiency owing to optimization of the film thickness of the functional layer and the efficiency and the operating life of the light-emitting elements owing to reduction in driving voltage, and also to improve the light extraction efficiency of light having a desired wavelength from light-emitting elements.

4. Method of Manufacturing Light-emitting Elements

Figure 5:
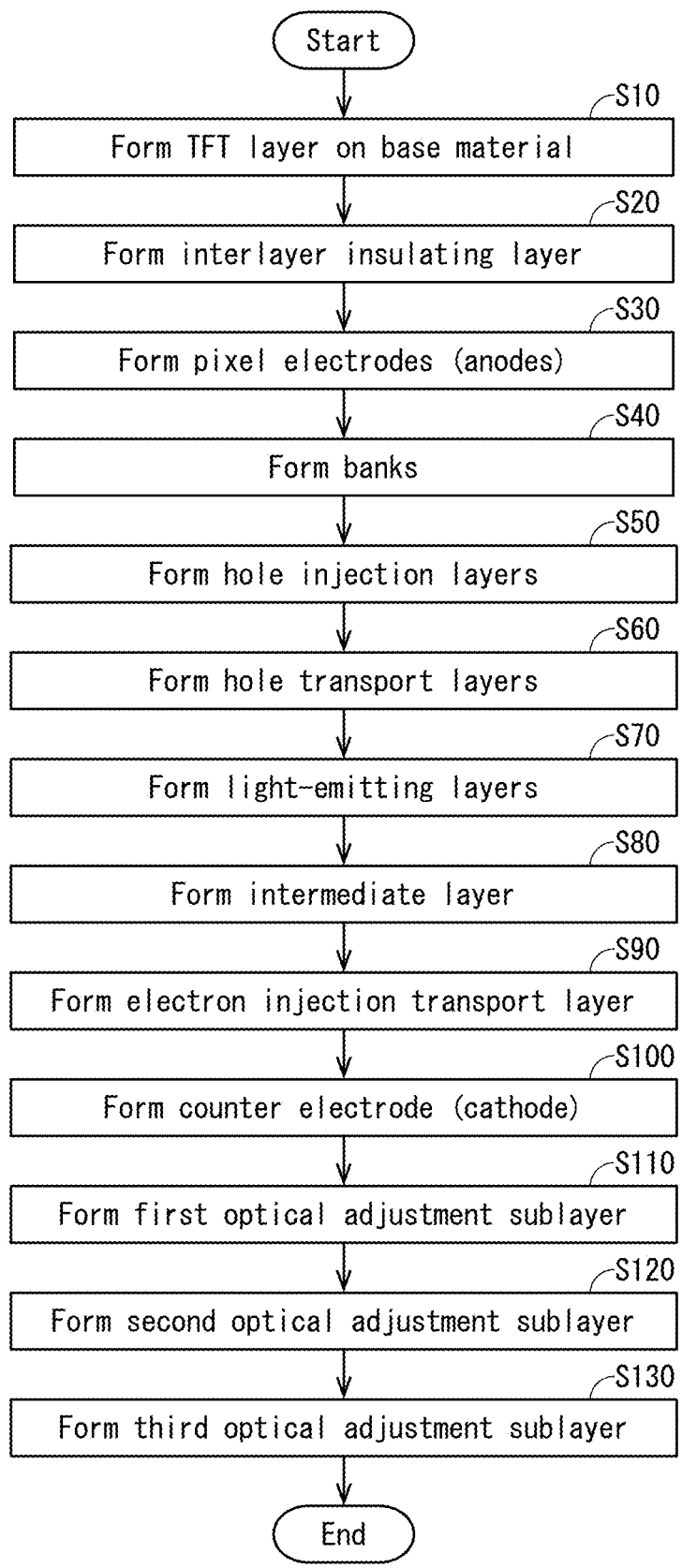
FIG. 5 is a flowchart of a manufacturing process of a self-luminous panel including organic EL elements pertaining to at least one embodiment.

A method of manufacturing a self-luminous panel including light-emitting elements is described with reference to the drawings. FIG. 5 is a flowchart illustrating a manufacturing process of a self-luminous panel including light-emitting elements. FIGS. 6A to 6E, 7A to 7D, 8A to 8D, and 9A to 9B are schematic cross-section diagrams illustrating the state in each process in manufacturing the self-luminous panel.

(1) Formation of Substrate 11

Figure 6A:
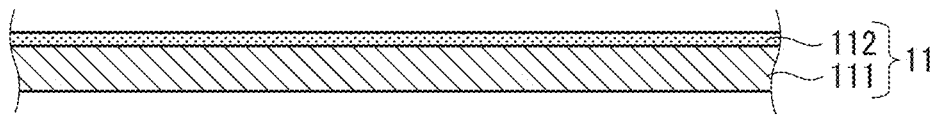
FIGS. 6A to 6E are partial cross-section diagrams schematically illustrating part of the manufacturing process of a self-luminous panel pertaining to at least one embodiment, where

First, as illustrated in FIG. 6A, a substrate 11 is formed by forming a TFT layer 112 on a base material 111 (Step S10). The TFT layer 112 can be formed by a known TFT manufacturing method.

(2) Formation of Interlayer Insulating Layer 12

Figure 6B:
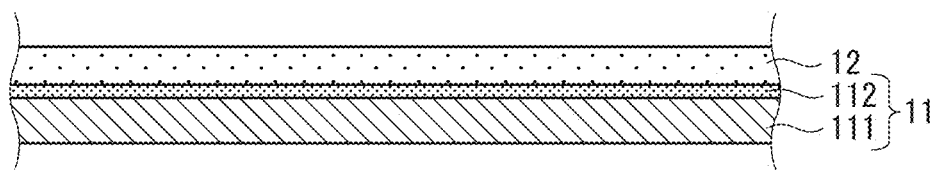

Next, as illustrated in FIG. 6B, an interlayer insulating layer 12 is formed on the substrate 11 (Step S20). The interlayer insulating layer 12 can be formed by lamination using for example plasma CVD or sputtering.

Next, dry-etching is performed on the interlayer insulating layer 12 to provide contact holes in parts of the interlayer insulating layer 12 which are located on source electrodes of the TFT layer 112. The contact holes are provided such that surfaces of the source electrodes are exposed in bottoms of the contact holes.

Next, connection electrode layers are formed along inner walls of the contact holes. Upper parts of the connection electrode layers are partially disposed on the interlayer insulating layer 12. The connection electrode layers are formed by forming a metal film for example by sputtering, and then patterning the metal film by photolithography and wet etching.

(3) Formation of Pixel Electrodes 13

Figure 6C:
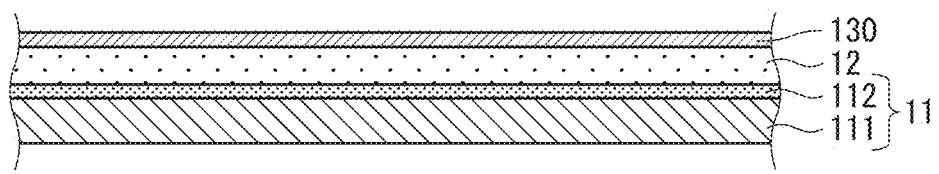

Next, as illustrated in FIG. 6C, a pixel electrode material layer 130 is formed on the interlayer insulating layer 12. The pixel electrode material layer 130 can be formed for example by vacuum deposition or sputtering.

Figure 6D:
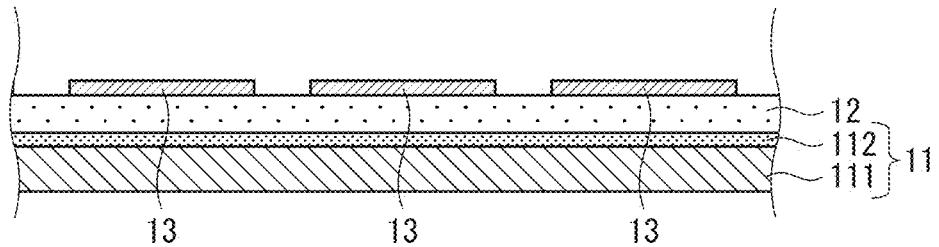

Next, as illustrated in FIG. 6D, the pixel electrode material layer 130 is patterned by etching to form a plurality of pixel electrodes 13 partitioned for each subpixel (Step S30).

(4) Formation of Banks 14

Figure 6E:
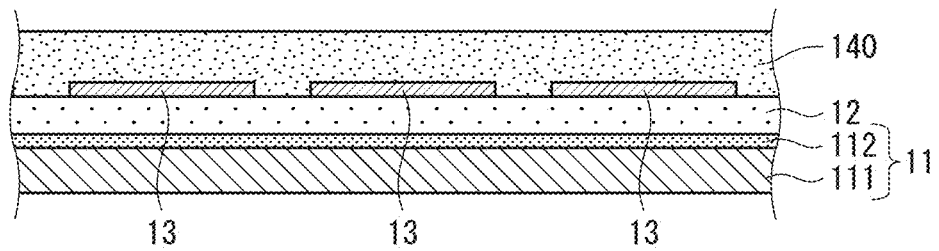

Next, as illustrated in FIG. 6E, resin for bank which is a material of banks 14 is applied onto the pixel electrodes 13 and the interlayer insulating layer 12 to form a bank material layer 140. The bank material layer 140 is formed by uniformly applying, onto the pixel electrodes 13 and the interlayer insulating layer 12, solution in which phenol resin, which is the resin for bank is dissolved in solvent (such as mixed solvent of ethyl lactate and gamma-butyrolactone (GBL)), by spin-coating or the like. Then, pattern exposure and developing are performed on the bank material layer 140 to form banks 14 (FIG. 7A), and the banks 14 are fired (Step S40). The banks 14 define apertures 14a which are regions in which light-emitting layers 17 are to be formed. Firing of the banks 14 is performed for example at a temperature of 150 degrees C. to 210 degrees C. for 60 minutes.

In at least one embodiment, in the process of forming the banks 14, surface processing is performed on surfaces of the banks 14 with use of predefined alkaline solution, water, organic solvent, or the like, or plasma processing is performed on the surfaces of the banks 14. This is performed in order to adjust a contact angle of the banks 14 relative to ink (solution) to be applied to the apertures 14a or in order to provide the surfaces of the banks 14 with water repellency.

(5) Formation of Hole Injection Layers 15

Figure 7A:
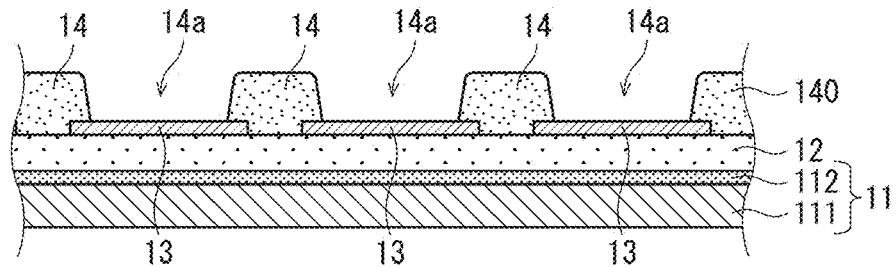
FIGS. 7A to 7D are partial cross-section diagrams schematically illustrating part of the manufacturing process of a self-luminous panel pertaining to at least one embodiment, where
Figure 7B:
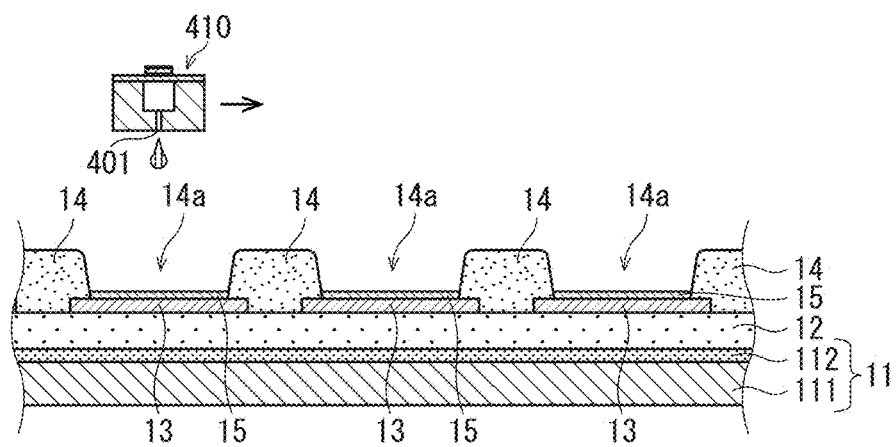

Next, as illustrated in FIG. 7B, an ink containing material of hole injection layers 15 is applied onto the apertures 14a, which are defined by the banks 14, from nozzles 401 of an inkjet head 410, and then the applied ink is fired (dried) so as to form hole injection layers 15 (Step S50).

Formation of the hole injection layers 15 is not limited to application. In at least one embodiment, the hole injection layers 15 is formed by deposition or the like. In at least one embodiment, in the case where the hole injection layers 15 are formed by deposition or sputtering, the following process is performed after formation of the pixel electrode material layer 130 in Step 30. Specifically, a hole injection material layer including the material of the hole injection layers 15 is formed on the pixel electrode material layer 130, and the pixel electrode material layer 130 and the hole injection material layer are patterned in the same patterning process so as to form a multi-layer structure of the pixel electrodes 13 and the hole injection layers 15.

(6) Formation of Hole Transport Layers 16

Figure 7C:
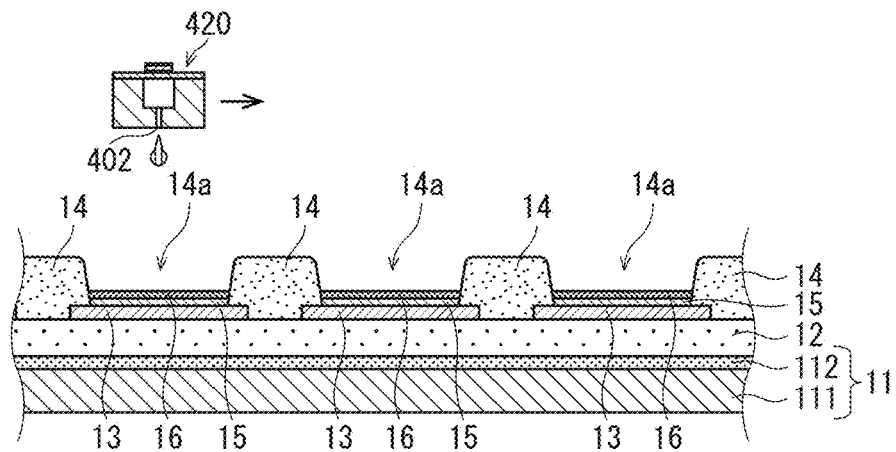

Next, as illustrated in FIG. 7C, an ink containing material of hole transport layers 16 is applied onto the hole injection layers 15 inside the apertures 14a, which are defined by the banks 14, from nozzles 402 of an inkjet head 420, and then the applied ink is heated (dried) so as to form hole transport layers 16 (Step S60).

Formation of the hole injection layers 16 is not limited to application. In at least one embodiment, the hole injection layers 16 is formed by deposition or the like. In at least one embodiment, in the case where the pixel electrodes 13, the hole injection layers 15, and the hole transport layers 16 are all formed by deposition or sputtering, these layers are patterned in the same patterning process as described above.

(7) Formation of Light-Emitting Layers 17

Figure 7D:
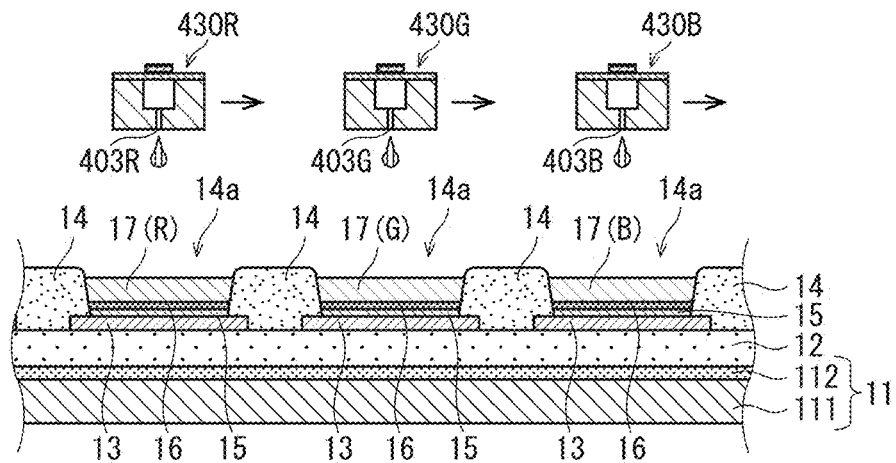

Next, as illustrated in FIG. 7D, an ink containing material of light-emitting layers 17 is applied onto the hole transport layers 16 inside the apertures 14*a* from nozzles 403R of an inkjet head 430R, nozzles 403G of an inkjet head 430G, and nozzles 403B of an inkjet head 430B, and then the applied ink is fired (dried) so as to form light-emitting layers 17 (Step S70).

(8) Formation of Intermediate Layer 18

Figure 8A:
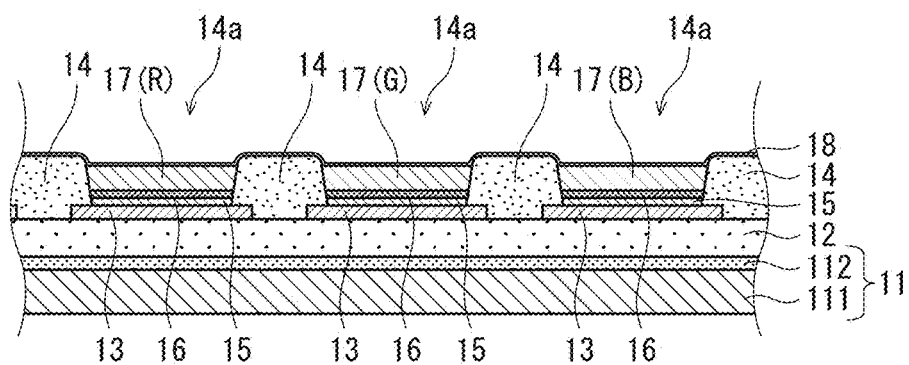
FIGS. 8A to 8D are partial cross-section diagrams schematically illustrating part of the manufacturing process of a self-luminous panel pertaining to at least one embodiment, where

Next, as illustrated in FIG. 8A, an intermediate layer 18 is formed on the light-emitting layers 17 and the banks 14 (Step S80). The intermediate layer 18 is formed for example by forming a film of NaF, which is alkali metal fluoride, for the entire subpixels by vacuum deposition.

(9) Formation of Electron Injection Transport Layer 19

Figure 8B:
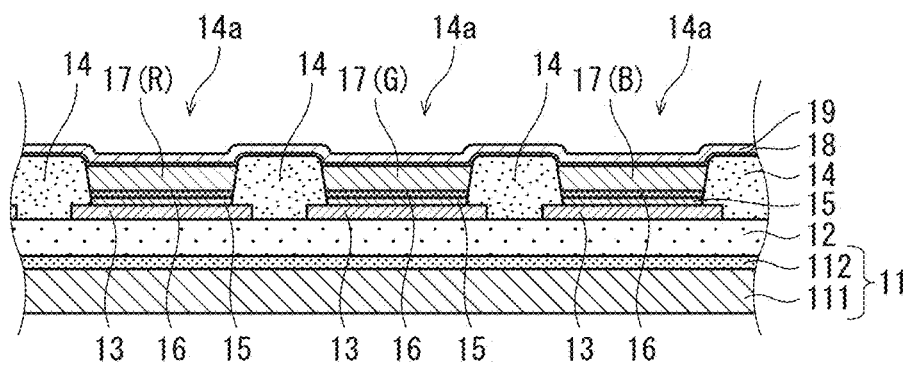

Next, as illustrated in FIG. 8B, an electron injection transport layer 19 is formed on the intermediate layer 18 (Step S90). The electron injection transport layer 19 is formed for example by forming a film of an organic material having an electron transport property and ytterbium as metal with which the organic material is doped, for the entire subpixels by co-deposition.

(10) Formation of Counter Electrode 20

Figure 8C:
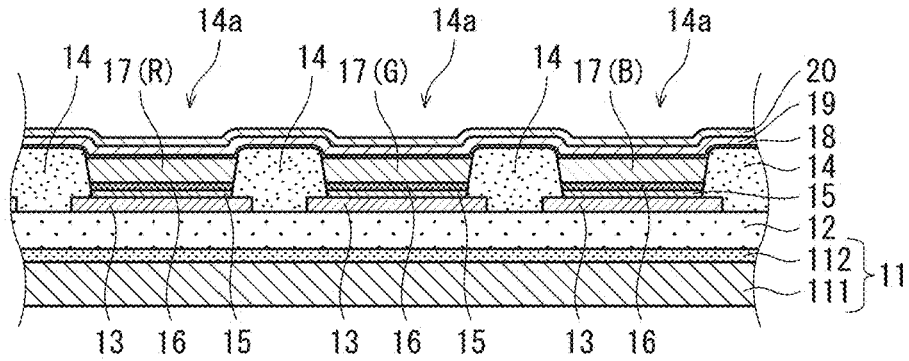

Next, as illustrated in FIG. 8C, a counter electrode 20 is formed on the electron injection transport layer 19 (Step S100). The counter electrode 20 is formed for example by forming a film of a metal material such as Ag and Al by sputtering or vacuum deposition.

(11) Formation of First Optical Adjustment Sublayer 211

Figure 8D:
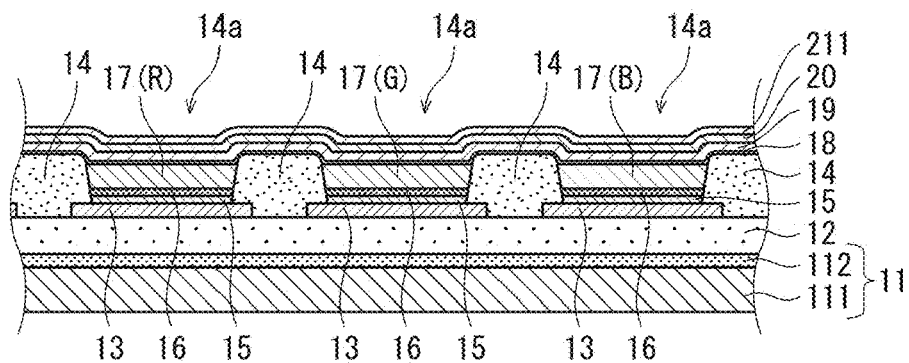

Next, as illustrated in FIG. 8D, a first optical adjustment sublayer 211 is formed (Step 5110). The first optical adjustment sublayer 211 is formed for example by forming an NbO film by sputtering.

(12) Formation of Second Optical Adjustment Sublayer 212

Figure 9A:
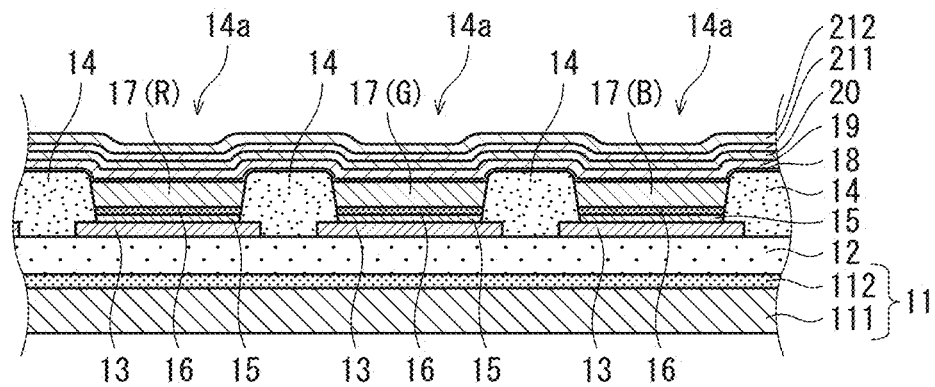
FIGS. 9A to 9B are partial cross-section diagrams schematically illustrating part of the manufacturing process of a self-luminous panel pertaining to at least one embodiment, where

Next, as illustrated in FIG. 9A, a second optical adjustment sublayer 212 is formed (Step S120). The second optical adjustment sublayer 212 is formed for example by using SiON by sputtering or CVD.

(13) Formation of Third Optical Adjustment Sublayer 213

Figure 9B:
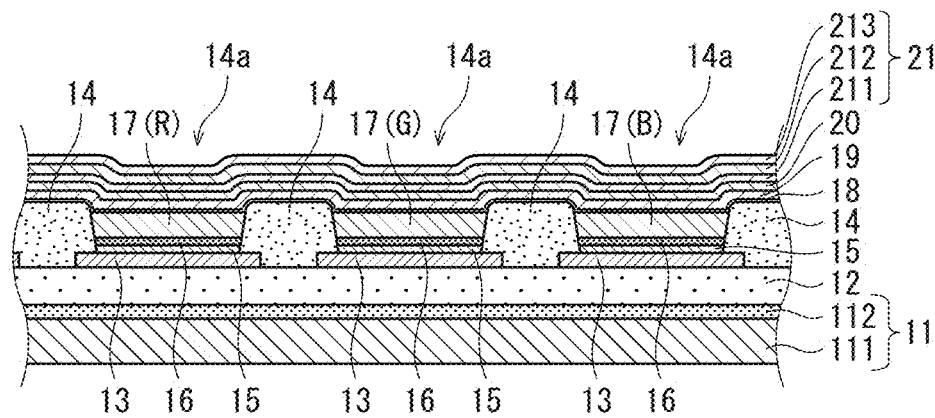

Next, as illustrated in FIG. 9B, a third optical adjustment sublayer 213 is formed (Step S130). The third optical adjustment sublayer 213 is formed for example by using SiN by sputtering or CVD.

In at least one embodiment, a layer having a sealing function is further formed on the third optical adjustment sublayer 213. In at least one embodiment, a color filter or an upper substrate is bonded onto the third optical adjustment sublayer 213.

5. Whole Structure of Display Device

FIG. 11 is a schematic block diagram of structure of a display device 1000 including the self-luminous panel 100. As illustrated in FIG. 11, the display device 1000 includes the self-luminous panel 100 and a drive control unit 200 that is connected to the self-luminous panel 100. The drive control unit 200 includes four drive circuits 210 to 240 and a control circuit 250.

In actual display devices 1000, the arrangement of the drive control unit 200 relative to the self-luminous panel 100 is not limited to the above arrangement.

«Modification 1»

The organic EL elements 1 as self-luminous elements pertaining to at least one embodiment have been described as including two cavity structures, namely, the first cavity structure and the second cavity structure. In at least one embodiment, self-luminous elements include other cavity structure as long as the self-luminous elements include the first cavity structure and the second cavity structure described above.

In the present modification, self-luminous elements are characterized in including at least one of a third cavity structure, a fourth cavity structure, and the like in addition to the first cavity structure and the second cavity structure.

1. Structure

FIG. 10A is a schematic cross-section diagram of self-luminous elements pertaining to the present modification. The self-luminous elements pertaining to the present modification differ from the above embodiment in terms of including an optical adjustment layer 21 which includes a first optical adjustment sublayer 211, a second optical adjustment sublayer 212, . . . , an n-th optical adjustment sublayer 21*n* (n is an integer of 4 or greater).

<Optical Adjustment Layer>

The optical adjustment layer 21, which includes four or more sublayers, incudes a light-transmissive material and is formed on a counter electrode 20.

The sublayers, which constitute the optical adjustment layer 21, each include a light-transmissive material and differ in material and refractive index from at least an adjacent sublayer. In at least one embodiment, among the sublayers constituting the optical adjustment layer 21, sublayers which are not adjacent to each other include the same material. For example, the following structure is employed that the first optical adjustment sublayer 211, the third optical adjustment sublayer 213, the fifth optical adjustment sublayer 215, . . . , each include silicon oxynitride, whereas the second optical adjustment sublayer 212, the fourth optical adjustment sublayer 214, the sixth optical adjustment sublayer 216, . . . , each include silicon nitride. A second cavity structure is formed between a pair of a light-reflecting surface of an interface between the first optical adjustment sublayer 211 and the second optical adjustment sublayer 212, among the sublayers constituting the optical adjustment layer 21, and a light-reflecting surface of an interface of the pixel electrode 13 with the hole injection layers 15. Accordingly, in at least one embodiment, the first optical adjustment sublayer 211 and the second optical adjustment sublayer 212 differ in refractive index from each other. In at least one embodiment, the difference in refractive index between the first optical adjustment sublayer 211 and the second optical adjustment sublayer 212 is 0.3 or greater.

Also, a third cavity structure is formed between a pair of at least one interface, among interfaces between each two adjacent sublayers constituting the optical adjustment layer 21, and the light-reflecting surface of the interface of the pixel electrode 13 with the hole injection layers 15. Specifically, the at least one interface is any among an interface between the second optical adjustment sublayer 212 and the third optical adjustment sublayer 213, an interface between the third optical adjustment sublayer 213 and the fourth optical adjustment sublayer 214, . . . , and an interface between the (n-1)-th optical adjustment sublayer 21(n-1) and the n-th optical adjustment sublayer 21*n*. Accordingly, in at least one embodiment, two sublayers which are relevant to formation of the third cavity structure differ in refractive index from each other. In at least one embodiment, a distance from the interface between the (n-1)-th optical adjustment sublayer 21(n-1) and the n-th optical adjustment sublayer 21*n*, which can be one reflective surface of the third cavity structure, to the surface of the counter electrode 20 facing the light-emitting layers 17, which is one reflective surface of the first cavity structure, is 1 µm or smaller.

Also, the number of interfaces which form the cavity structure is not limited to one. In at least one embodiment, a plurality of interfaces form the cavity structure.

2. First Mode of Optical Cavity Structure

A first cavity structure and a second cavity structure pertaining to the present modification are the same as those in the above embodiment. In the present modification, light-emitting elements further include a third cavity structure. Assume a case where the third cavity structure is formed between a pair of an interface between a (k-1)-th optical adjustment sublayer and a k-th optical adjustment sublayer (k is an integer of 3 or greater and n or less) and the light-reflecting surface of the interface of the pixel electrodes 13 with the hole injecting layer 15. In this case, the following relation is satisfied when a peak wavelength of emitted light obtained by the third cavity structure is denoted by $\lambda_3$, an optical distance from the interface between the (k-1)-th optical adjustment sublayer and the k-th optical adjustment sublayer to the emission center is denoted by $L_k$, and an optical distance between the two interfaces in the third cavity structure is denoted by $L_{kt}(=L_0+L_k)$.

$$2(L_0 + L_k) - \frac{\lambda_3(\phi_0 + \phi_k)}{2\pi} = m_3\lambda_3 \qquad \text{(Formula 7)}$$

Here, $\phi_k$ denotes a phase change of light reflected by the interface between the (k-1)-th optical adjustment sublayer and the k-th optical adjustment sublayer, and $m_3$ is any natural number.

In at least one embodiment, the peak wavelength $\lambda_3$ satisfies the following relation.

$$\lambda_2 < \lambda_3 < \lambda_1 \qquad \text{(Formula 8)}$$

With the above structure, light can be extracted even from even the third cavity structure such that the intensity of light having a desired wavelength increases. This is effective in improving the luminous efficiency and the light extraction efficiency of the light-emitting elements 1.

In at least one embodiment, the light-emitting elements further include at least one of a fourth cavity structure and a fifth cavity structure, in addition to the third cavity structure.

3. Second Mode of Optical Cavity Structure

In the first mode of optical cavity structure, light is extracted from the third cavity structure such that the intensity of light having a desired wavelength increases. In at least one embodiment, the third cavity structure has the following structure. Specifically, the third cavity structure is formed between a pair of the interface between the (k-1)-th optical adjustment sublayer and the k-th optical adjustment sublayer (k is an integer of 3 or greater and n or smaller) and the interfaces of the pixel electrodes 13 with the hole injection layers 15, such that the following relation is satisfied with respect to a certain wavelength $\lambda_4$.

$$2(L_0 + L_k) - \frac{\lambda_4(\phi_0 + \phi_k)}{2\pi} = \left(m_4 + \frac{1}{2}\right)\lambda_4 \qquad \text{(Formula 9)}$$

Here, $\phi_k$ denotes a phase change of light reflected by the interface between the (k-1)-th optical adjustment sublayer and the k-th optical adjustment sublayer, and $m_4$ is any natural number.

In at least one embodiment, the wavelength $\lambda_4$ satisfies the following relation.

$$\lambda_2 < \lambda_4 < \lambda_1 \qquad \text{(Formula 10)}$$

With the above structure, the third cavity structure is configured to cause light attenuation, with respect to the wavelength $\lambda_4$, on the path $C_1$ and the first cavity structure. The optical cavity structure improves the light extraction efficiency, and also exhibits an effect of increasing the directivity because of the optical distance depending on viewing angle, thereby exhibiting an action of narrowing the viewing angle. With the above structure, the third cavity structure can reduce narrowing of the viewing angle performed by the first cavity structure. This is effective in enlarging the viewing angle of the light-emitting elements 1.

In at least one embodiment, the light-emitting elements further include at least one of a fourth cavity structure and a fifth cavity structure, in addition to the third cavity structure.

«Modification 2»

The self-luminous panel including the light-emitting elements pertaining to the above embodiment is a panel of a top-emission type in which pixel electrodes are light-reflective electrodes and a counter electrode is a light-transmissive electrode. In at least one embodiment, the self-luminous panel is a panel of a bottom-emission type.

The self-luminous panel pertaining to the present modification is a panel of the bottom-emission type in which a counter electrode is a light-reflective electrode and pixel electrodes are light-transmissive electrodes.

1. Structure

FIG. 10B is a schematic cross-section diagram of the self-luminous panel pertaining to the present modification. The self-luminous panel pertaining to the present modification differs from the above embodiment in terms of including light-emitting elements 1 which include a third optical adjustment sublayer 223, a second optical adjustment sublayer 222, a first optical adjustment sublayer 221, light-transmissive pixel electrodes 131, . . . , light-emitting layers 17, . . . , a light-reflective counter electrode 201 which are layered on a substrate 11 in this order. In the case where light is emitted upwards, that is, in the case where the light-emitting elements include the light-reflective electrodes on the lower side and the light-transmissive electrode and the optical adjustment layer on the upper side, the present modification can be regarded as having the structure in which the self-luminous panel has the substrate not below the light-emitting elements which emit light upwards but above the light-emitting elements.

«Other Modifications»

(1) In at least one embodiment, the organic EL elements 1 as the light-emitting elements do not necessarily need to have the structure in the above embodiment including the hole injection layers 15, the hole transport layers 16, the intermediate layer 18, and the electron injection transport layer 19. In at least one embodiment, the organic EL elements 1 do not include any one or more of these layers. In at least one embodiment, the organic EL elements 1 further include other functional layer. For example, the organic EL elements 1 do not include the intermediate layer 18. Also, for example, the organic EL elements 1 include an electron transport layer instead of the intermediate layer 18 or between the intermediate layer 18 and the light-emitting layers 17.

Also, the above methods of manufacturing the functional layers are just examples. In at least one embodiment, the light-emitting layers 17 are formed by vapor deposition.

Also, in at least one embodiment, one or more of the optical adjustment sublayers are formed by spin-coating, application, or the like.

(2) In at least one embodiment, the self-luminous panel includes the light-emitting elements of three types emitting light of the three colors R, G, and B. In at least one embodiment, the light-emitting elements are of two types or four or more types. Here, the types of light-emitting elements indicate variation in each component of the light-emitting elements. Light emitting-elements which emit the same-color light but differ in film thickness of light-emitting layers and functional layers can be regarded as being of different types. Also, the arrangement order of the light-emitting elements is not limited to the order of RGBRGB . . . . In at least one embodiment, the light-emitting elements are arranged in the order of RGBBGRRGB . . . . In at least one embodiment, auxiliary electrode layers, other non-luminous regions, or the like are provided between the light-emitting elements.

Also, in at least one embodiment, the intermediate layer 18, the electron injection transport layer 19, the counter electrode 20, and the optical adjustment sublayers are each formed for the entire light-emitting elements. In at least one embodiment, these layers each have a different film thickness for each of the light-emitting elements.

(3) In at least one embodiment, the self-luminous panel includes the light-emitting elements which are disposed such that the electrode on the substrate side is the anode. In at least one embodiment, the light-emitting elements are disposed such that the electrode on the substrate side is the cathode. In this case, the optical adjustment layer is disposed so as to be in contact with the light-transmissive electrode of the light-emitting elements regardless of the polarity of the electrode.

(4) Display panels and display panel manufacturing methods pertaining to the present disclosure have been described based on embodiments and modifications, but the present disclosure is not limited to the embodiments and modifications described.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. A light-emitting element, comprising:
a first electrode that is light-reflective;
a light-emitting layer disposed above the first electrode;
a second electrode that is light-transmissive and is disposed above the light-emitting layer;
a first light-transmissive layer disposed on the second electrode; and
a second light-transmissive layer disposed on the first light-transmissive layer, wherein
a first optical cavity structure is formed between a first surface of the first electrode facing the light-emitting layer and a second surface of the second electrode facing the light-emitting layer,
a first wavelength is a peak wavelength of the first optical cavity structure, the first wavelength being longer than a peak wavelength of light emitted from the light-emitting layer,
a second optical cavity structure is formed between the first surface of the first electrode and an interface between the first light-transmissive layer and the second light-transmissive layer,
a second wavelength is a peak wavelength of the second optical cavity structure, the second wavelength being shorter than the first wavelength,
the first light-transmissive layer and the second light-transmissive layer differ in refractive index from each other by 0.3 or greater, and
the following relations are met:
$\lambda-15$ nm $< \lambda_s < \lambda+15$ nm,
$\lambda_s-20$ nm $< \lambda_1$, and
$\lambda_2 < \lambda_s+20$ nm, where
$\lambda$ is the peak wavelength of light emitted from the light emitting layer,
$\lambda_1$ is the first wavelength,
$\lambda_2$ is the second wavelength, and
$\lambda_s$ is a peak wavelength of light extracted from the light-emitting element.

2. The light-emitting element of claim 1, wherein the light extracted from the light-emitting element is obtained by synthesizing light emitted from the first optical cavity structure and light emitted from the second optical cavity structure.

3. The light-emitting element of claim 1, wherein the following relation is satisfied:

$$2(L_0 + L_1) - \frac{\lambda_1(\phi_0 + \phi_1)}{2\pi} = m_1\lambda_1,$$

where
$L_0$ denotes an optical distance from the first surface of the first electrode facing the light-emitting layer to an emission center inside the light-emitting layer,
$L_1$ denotes an optical distance from the emission center to the second surface of the second electrode facing the light-emitting layer,
$\phi_0$ denotes a phase change of light reflected by the first surface of the first electrode facing the light-emitting layer,
$\phi_1$ denotes a phase change of light reflected by the second surface of the second electrode facing the light-emitting layer, and
$m_1$ is any natural number.

4. The light-emitting element of claim 1, wherein the following relation is satisfied:

$$2(L_0 + L_2) - \frac{\lambda_2(\phi_0 + \phi_2)}{2\pi} = m_2\lambda_2,$$

where
$L_0$ denotes an optical distance from the first surface of the first electrode facing the light-emitting layer to an emission center inside the light-emitting layer,
$L_1$ denotes an optical distance from the emission center to the second surface of the second electrode facing the light-emitting layer,
$\phi_0$ denotes a phase change of light reflected by the first surface of the first electrode facing the light-emitting layer,
$\phi_2$ denotes a phase change of light reflected by the second surface of the second light-transmissive layer facing the light-emitting layer, and
$m_2$ is any natural number.

5. The light-emitting element of claim 1, further comprising
   a third light-transmissive layer that is disposed on the second light-transmissive layer and includes one or more sublayers, wherein
   a third optical cavity structure is formed between the surface of the first electrode facing the light-emitting layer and a surface of any of the sublayers that are included in the third light-transmissive layer, the surface of the any sublayer facing the light-emitting layer, and
   an optical distance between the surface of the second electrode facing the light-emitting layer and an upper surface of the third light-transmissive layer is 1 μm or smaller.

6. The light-emitting element of claim 5, wherein the third optical cavity structure is configured to cause attenuation on the peak wavelength of the first optical cavity structure.

7. The light-emitting element of claim 5, wherein the third optical cavity structure corresponds to a third wavelength as a peak wavelength, the third wavelength being between the first wavelength and the second wavelength.

8. A light-emitting element, comprising:
   a first electrode that is light-reflective;
   a light-emitting layer disposed above the first electrode;
   a second electrode that is light-transmissive and is disposed above the light-emitting layer;
   a first light-transmissive layer disposed on the second electrode; and
   a second light-transmissive layer disposed on the first light-transmissive layer, wherein
   a first optical cavity structure is formed between a first surface of the first electrode facing the light-emitting layer and a second surface of the second electrode facing the light-emitting layer,
   a first wavelength is a peak wavelength of the first optical cavity structure, the first wavelength being longer than a peak wavelength of light emitted from the light-emitting layer,
   a second optical cavity structure is formed between the first surface of the first electrode facing and an interface between the first light-transmissive layer and the second light-transmissive layer,
   a second wavelength is a peak wavelength of the second optical cavity structure, the second wavelength being shorter than the first wavelength,
   the first light-transmissive layer includes indium zinc oxide (IZO) or niobium oxide (NbO),
   the second light-transmissive layer includes silicon oxynitride (SiON), and
   the following relations are met:
   $\lambda - 15$ nm $< \lambda_s < \lambda + 15$ nm,
   $\lambda_s - 20$ nm $< \lambda_1$, and
   $\lambda_2 < \lambda_s + 20$ nm, where
   $\lambda$ is the peak wavelength of light emitted from the light emitting layer,
   $\lambda_1$ is the first wavelength,
   $\lambda_2$ is the second wavelength, and
   $\lambda_s$ is a peak wavelength of light extracted from the light-emitting element.

9. A self-luminous panel, comprising:
   a plurality of light-emitting elements formed on a substrate, each of the light-emitting elements includes:
   a first electrode that is light-reflective;
   a light-emitting layer disposed above the first electrode;
   a second electrode that is light-transmissive and is disposed above the light-emitting layer;
   a first light-transmissive layer disposed on the second electrode; and
   a second light-transmissive layer disposed on the first light-transmissive layer, wherein for each light-emitting element:
   a first optical cavity structure is formed between a first surface of the first electrode facing the light-emitting layer and a second surface of the second electrode facing the light-emitting layer,
   a first wavelength is a peak wavelength of the first optical cavity structure, the first wavelength being longer than a peak wavelength of light emitted from the light-emitting layer,
   a second optical cavity structure is formed between the first surface of the first electrode and an interface between the first light-transmissive layer and the second light-transmissive layer,
   a second wavelength is a peak wavelength of the second optical cavity structure, the second wavelength being shorter than the first wavelength,
   the first light-transmissive layer and the second light-transmissive layer differ in refractive index from each other by 0.3 or greater, and
   the following relations are met:
   $\lambda - 15$ nm $< \lambda_s < \lambda + 15$ nm,
   $\lambda_s - 20$ nm $< \lambda_1$, and
   $\lambda_2 < \lambda_s + 20$ nm, where
   $\lambda$ is the peak wavelength of light emitted from the light emitting layer,
   $\lambda_1$ is the first wavelength,
   $\lambda_2$ is the second wavelength, and
   $\lambda_s$ is a peak wavelength of light extracted from the light-emitting element.

10. A self-luminous panel, comprising:
    a substrate including a light-transmissive part that is light-transmissive;
    a second light-transmissive layer disposed above the light-transmissive part of the substrate;
    a first light-transmissive layer disposed on the second light-transmissive layer;
    a second electrode that is light-transmissive and is disposed above the first light-transmissive layer;
    a light-emitting layer disposed above the second electrode; and
    a first electrode that is light-reflective and is disposed above the light-emitting layer, wherein
    a first optical cavity structure is formed between a first surface of the first electrode facing the light-emitting layer and a second surface of the second electrode facing the light-emitting layer,
    a first wavelength is a peak wavelength of the first optical cavity structure, the first wavelength being longer than a peak wavelength of light emitted from the light-emitting layer,
    a second optical cavity structure is formed between the first surface of the first electrode and an interface between the first light-transmissive layer and the second light-transmissive layer,
    a second wavelength is a peak wavelength of the second optical cavity structure, the second wavelength being shorter than the first wavelength,
    the first light-transmissive layer and the second light-transmissive layer differ in refractive index from each other by 0.3 or greater, and the following relations are met:
$\lambda-15$ nm$<\lambda_s<\lambda+15$ nm,
$\lambda_s-20$ nm$<\lambda_1$, and
$\lambda_2<\lambda_s+20$ nm, where
$\lambda$ is the peak wavelength of light emitted from the light emitting layer,
$\lambda_1$ is the first wavelength,
$\lambda_2$ is the second wavelength, and
$\lambda_s$ is a peak wavelength of light extracted from the light-emitting element.

11. A self-luminous panel, comprising:
a substrate including a light-transmissive part that is light-transmissive;
a second light-transmissive layer disposed above the light-transmissive part of the substrate;
a first light-transmissive layer disposed on the second light-transmissive layer;
a second electrode that is light-transmissive and is disposed above the first light-transmissive layer;
a light-emitting layer disposed above the second electrode; and
a first electrode that is light-reflective and is disposed above the light-emitting layer, wherein
a first optical cavity structure is formed between a first surface of the first electrode facing the light-emitting layer and a second surface of the second electrode facing the light-emitting layer,
a first wavelength is a peak wavelength of the first optical cavity structure, the first wavelength being longer than a peak wavelength of light emitted from the light-emitting layer,
a second optical cavity structure is formed between the first surface of the first electrode and an interface between the first light-transmissive layer and the second light-transmissive layer,
a second wavelength is a peak wavelength of the second optical cavity structure, the second wavelength being shorter than the first wavelength,
the first light-transmissive layer includes indium zinc oxide (IZO) or niobium oxide (NbO), and
the second light-transmissive layer includes silicon oxynitride (SiON), and
the following relations are met:
$\lambda-15$ nm$<\lambda_s<\lambda+15$ nm,
$\lambda_s-20$ nm$<\lambda_1$, and
$\lambda_2<\lambda_s+20$ nm, where
$\lambda$ is the peak wavelength of light emitted from the light emitting layer,
$\lambda_1$ is the first wavelength,
$\lambda_2$ is the second wavelength, and
$\lambda_s$ is a peak wavelength of light extracted from the light-emitting element.

12. A method of manufacturing a light-emitting element, the method comprising:
forming a first electrode that is light-reflective on a substrate;
forming a light-emitting layer above the first electrode;
forming a second electrode that is light-transmissive above the light-emitting layer;
forming a first light-transmissive layer on the second electrode; and
forming a second light-transmissive layer on the first light-transmissive layer, wherein
in the forming of the second electrode, a first optical cavity structure is formed between a first surface of the first electrode facing the light-emitting layer and a second surface of the second electrode facing the light-emitting layer,
a first wavelength is a peak wavelength of the first optical cavity structure, the first wavelength being longer than a peak wavelength of light emitted from the light-emitting layer,
in the forming of the second light-transmissive layer, a second optical cavity structure is formed between the first surface of the first electrode and an interface between the first light-transmissive layer and the second light-transmissive layer,
a second wavelength is a peak wavelength of the second optical cavity structure, the second wavelength being shorter than the first wavelength,
the first light-transmissive layer and the second light-transmissive layer differ in refractive index from each other by 0.3 or greater, and
the following relations are met:
$\lambda-15$ nm$<\lambda_s<\lambda+15$ nm,
$\lambda_s-20$ nm$<\lambda_1$, and
$\lambda_2<\lambda_s+20$ nm, where
$\lambda$ is the peak wavelength of light emitted from the light emitting layer,
$\lambda_1$ is the first wavelength,
$\lambda_2$ is the second wavelength, and
$\lambda_s$ is a peak wavelength of light extracted from the light-emitting element.

13. A method of manufacturing a light-emitting element, the method comprising:
forming a first electrode that is light-reflective on a substrate;
forming a light-emitting layer above the first electrode;
forming a second electrode that is light-transmissive above the light-emitting layer;
forming a first light-transmissive layer on the second electrode; and
forming a second light-transmissive layer on the first light-transmissive layer, wherein
in the forming of the second electrode, a first optical cavity structure is formed between a first surface of the first electrode facing the light-emitting layer and a second surface of the second electrode facing the light-emitting layer,
a first wavelength is a peak wavelength of the first optical cavity structure, the first wavelength being longer than a peak wavelength of light emitted from the light-emitting layer,
in the forming of the second light-transmissive layer, a second optical cavity structure is formed between the first surface of the first electrode and an interlace between the first light-transmissive layer and the second light-transmissive layer,
a second wavelength is a peak wavelength of the second optical cavity structure, the second wavelength being shorter than the first wavelength,
the first light-transmissive layer includes indium zinc oxide (IZO) or niobium oxide (NbO),
the second light-transmissive layer includes silicon oxynitride (SiON), and
the following relations are met:
$\lambda-15$ nm$<\lambda_s<\lambda+15$ nm,
$\lambda_s-20$ nm$<\lambda_1$, and
$\lambda_2<\lambda_s+20$ nm, where
$\lambda$ is the peak wavelength of light emitted from the light emitting layer,
$\lambda_1$ is the first wavelength, $\lambda_2$ is the second wavelength, and $\lambda_s$ is a peak wavelength of light extracted from the light-emitting element.

14. A method of manufacturing a light-emitting element, the method comprising:

forming a second light-transmissive layer on a substrate;

forming a first light-transmissive layer on the second light-transmissive layer;

forming a second electrode that is light-transmissive above the first light-transmissive layer;

forming a light-emitting layer above the second electrode; and forming a first electrode that is light-reflective above the light-emitting layer, wherein in the forming of the second electrode, a first optical cavity structure is formed between a first surface of the first electrode facing the light-emitting layer and a second surface of the second electrode facing the light-emitting layer, a first wavelength is a peak wavelength of the first optical cavity structure, the first wavelength being longer than a peak wavelength of light emitted from the light-emitting layer, in the forming of the second light-transmissive layer, a second optical cavity structure is formed between the first surface of the first electrode and an interface between the first light-transmissive layer and the second light-transmissive layer, a second wavelength is a peak wavelength, the second wavelength being shorter than the first wavelength, the first light-transmissive layer and the second light-transmissive layer differ in refractive index from each other by 0.3 or greater, and the following relations are met:

$\lambda - 15$ nm $< \lambda_s < \lambda + 15$ nm, $\lambda_s - 20$ nm $< \lambda_1$, and $\lambda_2 < \lambda_s + 20$ nm, where $\lambda$ is the peak wavelength of light emitted from the light emitting layer, $\lambda_1$ is the first wavelength, $\lambda_2$ is the second wavelength, and $\lambda_s$ is a peak wavelength of light extracted from the light-emitting element.

15. A method of manufacturing a light-emitting element, the method comprising:

forming a second light-transmissive layer on a substrate;

forming a first light-transmissive layer on the second light-transmissive layer;

forming a second electrode that is light-transmissive above the first light-transmissive layer;

forming a light-emitting layer above the second electrode; and forming a first electrode that is light-reflective above the light-emitting layer, wherein in the forming of the second electrode, a first optical cavity structure is formed between a first surface of the first electrode facing the light-emitting layer and a second surface of the second electrode facing the light-emitting layer, a first wavelength is a peak wavelength of the first optical cavity structure, the first wavelength being longer than a peak wavelength of light emitted from the light-emitting layer, in the forming of the second light-transmissive layer, a second optical cavity structure is formed between the first surface of the first electrode and an interface between the first light-transmissive layer and the second light-transmissive layer, a second wavelength is a peak wavelength of the first optical cavity structure, the second wavelength being shorter than the first wavelength, the first light-transmissive layer includes indium zinc oxide (IZO) or niobium oxide (NbO), the second light-transmissive layer includes silicon oxynitride (SiON), and the following relations are met:

$\lambda - 15$ nm $< \lambda_s < \lambda + 15$ nm, $\lambda_s - 20$ nm $< \lambda_1$, and $\lambda_2 < \lambda_s + 20$ nm, where $\lambda$ is the peak wavelength of light emitted from the light emitting layer, $\lambda_1$ is the first wavelength, $\lambda_2$ is the second wavelength, and $\lambda_s$ is a peak wavelength of light extracted from the light-emitting element.

* * * * *